US005635827A

United States Patent [19]
Judd et al.

[11] Patent Number: 5,635,827
[45] Date of Patent: Jun. 3, 1997

[54] POWER CONTROL SYSTEM

[75] Inventors: Robert A. Judd; Lawrence A. Crane, both of Winona, Minn.

[73] Assignee: Watlow Electric Manufacturing Company, Fenton, Mo.

[21] Appl. No.: 692,767

[22] Filed: Aug. 6, 1996

Related U.S. Application Data

[63] Continuation of Ser. No. 324,920, Nov. 18, 1994, abandoned.
[51] Int. Cl.⁶ ............................. G05B 24/02; H02J 1/00
[52] U.S. Cl. ...................... 323/321; 323/324; 323/902
[58] Field of Search .......................... 323/321, 324, 323/349, 350, 902, 909

[56] References Cited

U.S. PATENT DOCUMENTS

| | | | |
|---|---|---|---|
| 4,296,331 | 10/1981 | Rodriguez | 250/551 |
| 4,710,699 | 12/1987 | Miyamoto | 323/324 |
| 4,743,834 | 5/1988 | Rice | 323/239 |
| 5,138,184 | 8/1992 | Keefe | 307/64 |
| 5,146,386 | 9/1992 | Learned | 361/91 |

*Primary Examiner*—Stuart N. Hecker
*Attorney, Agent, or Firm*—Herzog, Crebs & McGhee LLP

[57] ABSTRACT

A power control system in a DIN rail mount assembly for switching power in a low cost, compact, and solid state for controlling electric heaters. The system can be used for single phase, three phase-two leg, and three phase-three leg. Current switching capabilities range from 30A to 50A. Variable time base, 4–20 mA process control or VAC/DC input contactor configurations can be utilized. The DIN Rail back plate includes a sliding mechanical configuration. A potting fence provides for potting of the electrical substrate and also provides a heat sink. A large cover covers finger palm safer terminals. The DIN rail assembly can also be used for supporting electrical, electromechanical, optical or other types of assemblies.

7 Claims, 17 Drawing Sheets

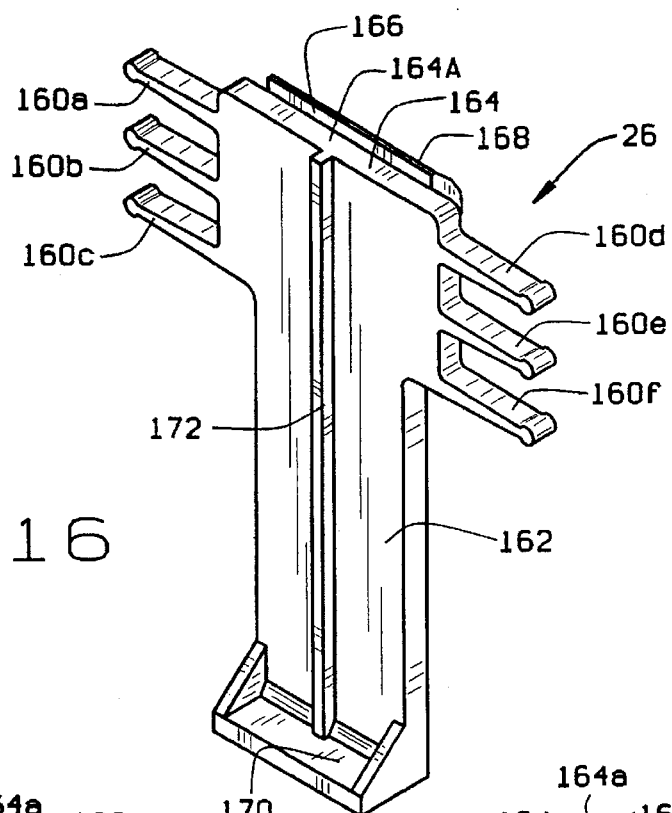
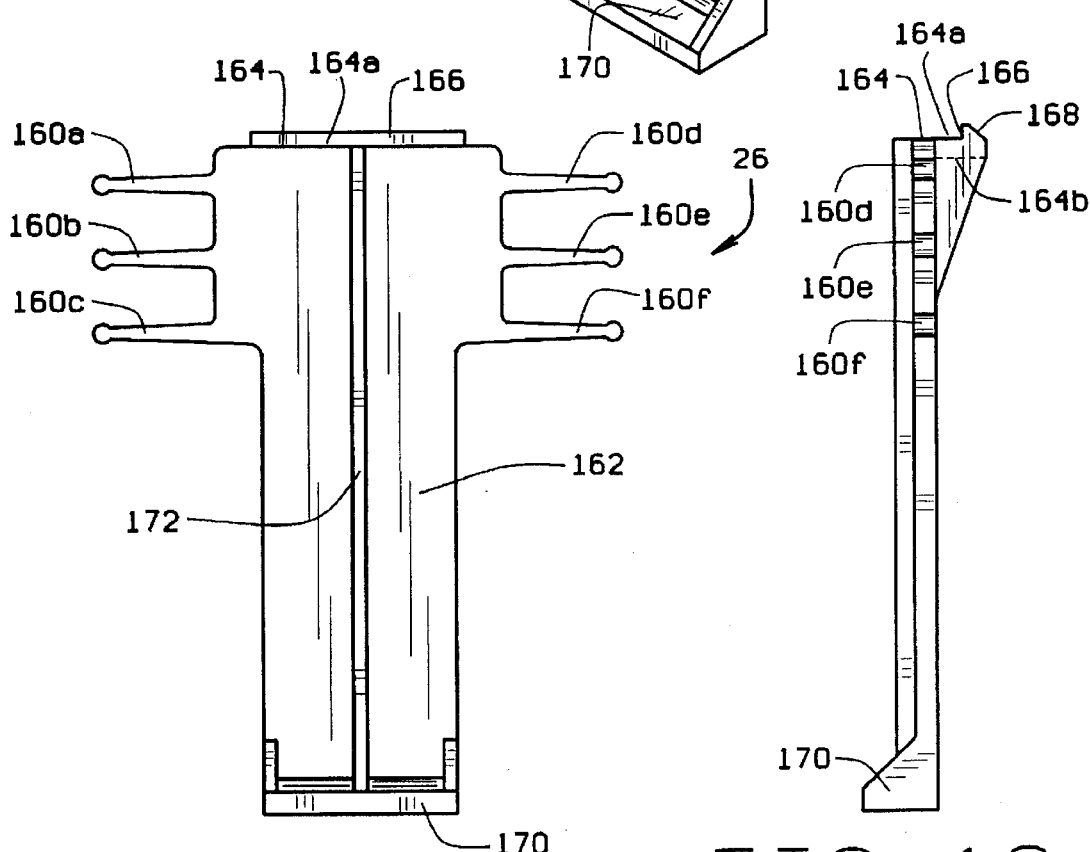
FIG. 16
FIG. 17
FIG. 18

POWER CONTROL SYSTEM

CROSS REFERENCES TO APPLICATIONS

This application is a continuation of U.S. patent application Ser. No. 08/324,920 filed Nov. 18, 1994 entitled POWER CONTROL SYSTEM now abandoned.

BACKGROUND OF THE INVENTION

1. Field of the Invention

The present invention is for a power controller, and more particularly, pertains to a power controller in a DIN rail assembly such as for controlling a heater element.

2. Description of the Prior Art

Prior art power controllers include (1) the Ruziere control (Contential); (2) the Omron; (3) the Buss Fuse (rail mount); and (4) the "Durakool 30/30." The prior art power controllers were not easily DIN rail mounted or were not state of the art solid state power controllers, especially for controlling electric heaters.

The present invention overcomes the disadvantages of the prior art by providing a solid state power control in a DIN rail mount assembly for switching power such as to an electric heater.

SUMMARY OF THE INVENTION

The general purpose of the present invention is a power control system which is mounted in a DIN rail assembly.

According to one embodiment of the present invention, there is provided a power control system, including a DIN rail. The power control system centers about a heat sink. Circuitry, part of which is encased in a potting medium, is located at the forward portion of the heat sink. The circuitry is captured in place by components at the forward portion of the heat sink which also form a potting fence. A large cover, having a small sub cover, aligns to the forward portion of the heat sink to cover underlying circuitry in the forward portion of the heat sink. The rearward edge of the heat sink slidingly engages a back plate assembly including a sliding member which facilitates rapid and easy engagement of the entire power control system assembly to a DIN rail. According to another embodiment of the present invention, circuitry is provided for sensing and SCR switching as well as alarm circuitry.

One significant aspect and feature of the present invention is power control system in a DIN rail assembly.

Another significant aspect and feature of the present invention is a DIN rail assembly which can support other electrical, electromechanical, optical or other types of assemblies.

Still another significant aspect and feature of the present invention is a back plate including ribs which interface with a DIN rail to provide a stop when the power control system is mounted in an inverted non-operational position such as for transit. In this position mechanical load is bearing on the end grain of the ribs and not transferred to the slider where it would result in continuous loading and eventual creep.

Yet another significant aspect and feature of the present invention is the method of capturing compression terminals adjacent to a potted mass which provides support for torque due to the wire attachment and presents the transfer of stress to a substrate assembly.

Yet still another significant aspect and feature of the present invention is the interaction of the potting fence with the heat sink to capture the potting fence from 5 directions, and the potting fence interaction with a large cover to capture the 6th direction of movement.

More significant aspects and features of the present invention is the multi-purpose construction which seals the ends of the heat sink for potting, aligns the buss bars, holds the compression terminals, provides the link between the attachment of the heat sink, and cover, and provides the necessary electrical insulation and mechanical strength requirements.

Still more significant aspect and feature of the present invention is in the substrate assembly where the interplay of the substrate assembly bus bar and input pin details with the heat sink/potting dam/cover/terminals.

A further significant aspect and feature of the present invention are internal baffles which provide the electrical spacing requirements defined by U.L. & C.S.A.

A still further significant aspect and feature of the present invention is screwdriver access holes which ensure positive engagement of screwdriver to screws. These access holes also possess an internal capturing detail to prevent the compression terminal screw from falling out through their respective access holes while providing continuous pressure to the compression terminals via the screw length.

Yet further significant aspect and feature of the present invention is interaction between a stationary back plate and a movable slider to achieve a spring loaded locking mechanism with only 2 parts.

More further significant aspect and feature of the present invention is a chassis mount in mercury displacement relay (MDR) footprint width and rail mount achieved using only 2 parts. A low profile allowing for flush attachment of a stationary back plate to a heat sink in a minimum amount of space. The back plate which accommodates a movable slider including a mechanical stop for the slider which prevents overflexing of spring beams of the slider.

One very significant aspect and feature of the present invention is input circuitry which emulates the operation of a contractor (a mechanical or a mercury displacement relay, MDR) in that it has defined "pull-in" and "drop-out" regions correlating to specific coil voltages.

One more significant aspect and feature of the present invention is the circuitry which allows product to operate as direct replacement in applications which are driven by common solid state output devices which have a R-C "snubber" in parallel with them. The ability of the circuitry provides the alarm feature with an AC input. The circuitry can be one, two or three phases.

Having thus described embodiments of the present invention, it is the principal object of the present invention to provide a power control system in a DIN rail assembly.

One object of the present invention is to provide potting dams or fences which are captured within structure.

Another object of the present invention is quick fastening of a power control system to a DIN rail.

Still another object of the present invention is to provide solid state power control in MDR footprint width.

Yet another object of the present invention is to provide "finger-palm" safety for power control wiring.

A further object of the present invention is a power control which provides a low cost, compact and versatile solid state option for controlling electric heat. Basic features include single phase, three phase-two leg, and three phase-three leg, 120–660 VAC operation. Current switching capabilities range from 30 to 50A depending on the model. Variable time base, 4–20 mA process control or VAC/VDC input contractor versions are available.

Still further objects of the present invention include:
DIN rail or standard panel mount,
Compact size,
Finger palm safe terminals,
Single and three phase power,
Shorted output detector,
No mercury, and
Faster switching with solid state.

Still additional objects of the present invention include:
Versatile, quick and low cost installation,
Reduced panel space and less cost,
Increased safety for installer/user,
Can be used in a variety of applications,
Notifies one in case of a shorted output,
Environmentally safe,
Saves energy, extends heater life, and
Thermal loop single source.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 16 illustrates an isometric view of the moveable slider;

FIG. 17 illustrates a front view of the moveable slider;

FIG. 18 illustrates a side view of the moveable slider;

DETAILED DESCRIPTION OF THE PREFERRED EMBODIMENTS

Figure 1:
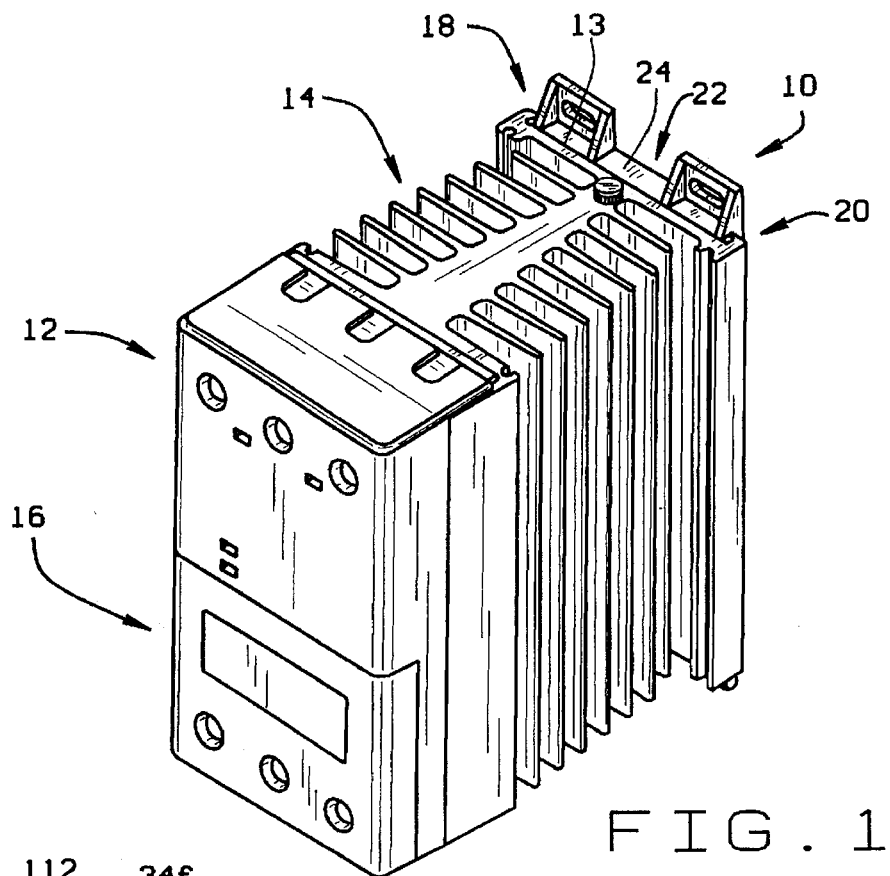
FIG. 1 illustrates an isometric view of a power control system, the present invention.

FIG. 1 illustrates a power control system 10 which is DIN rail mountable or panel mountable in MDR width. Included in the illustration is a large cover 12 engaged over and about the forward portion of a heat sink 14. A small cover 16 snappingly engages the lower portion of the large cover 12. The heat sink 14 having capturing channel members 18 and 20 at the ends of a rear panel 13 engages a back plate assembly 22 including a back plate 24 and a moveable slider 26 illustrated in FIG. 3.

Figure 2:
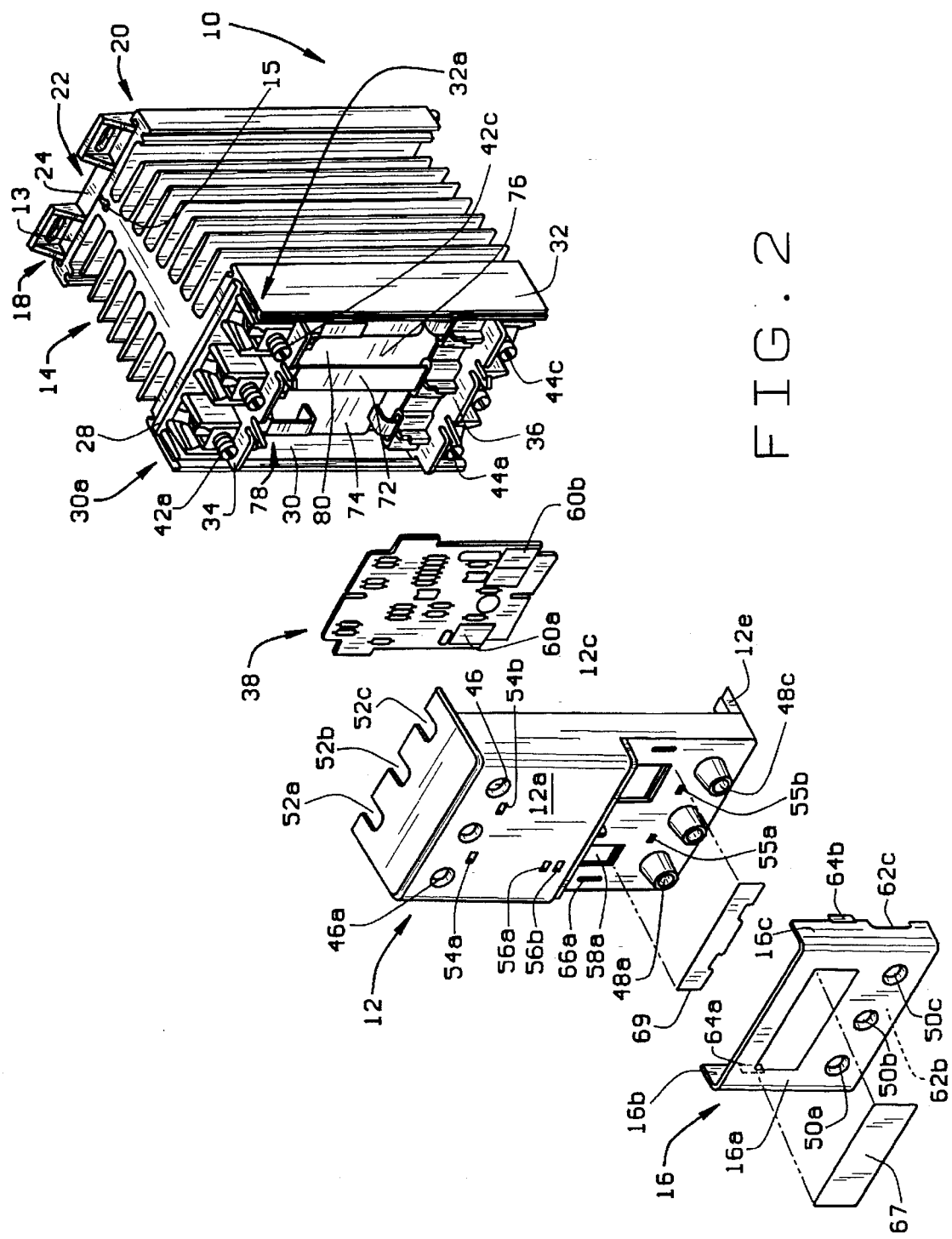
FIG. 2 illustrates an exploded view of the power control system.
Figure 3:
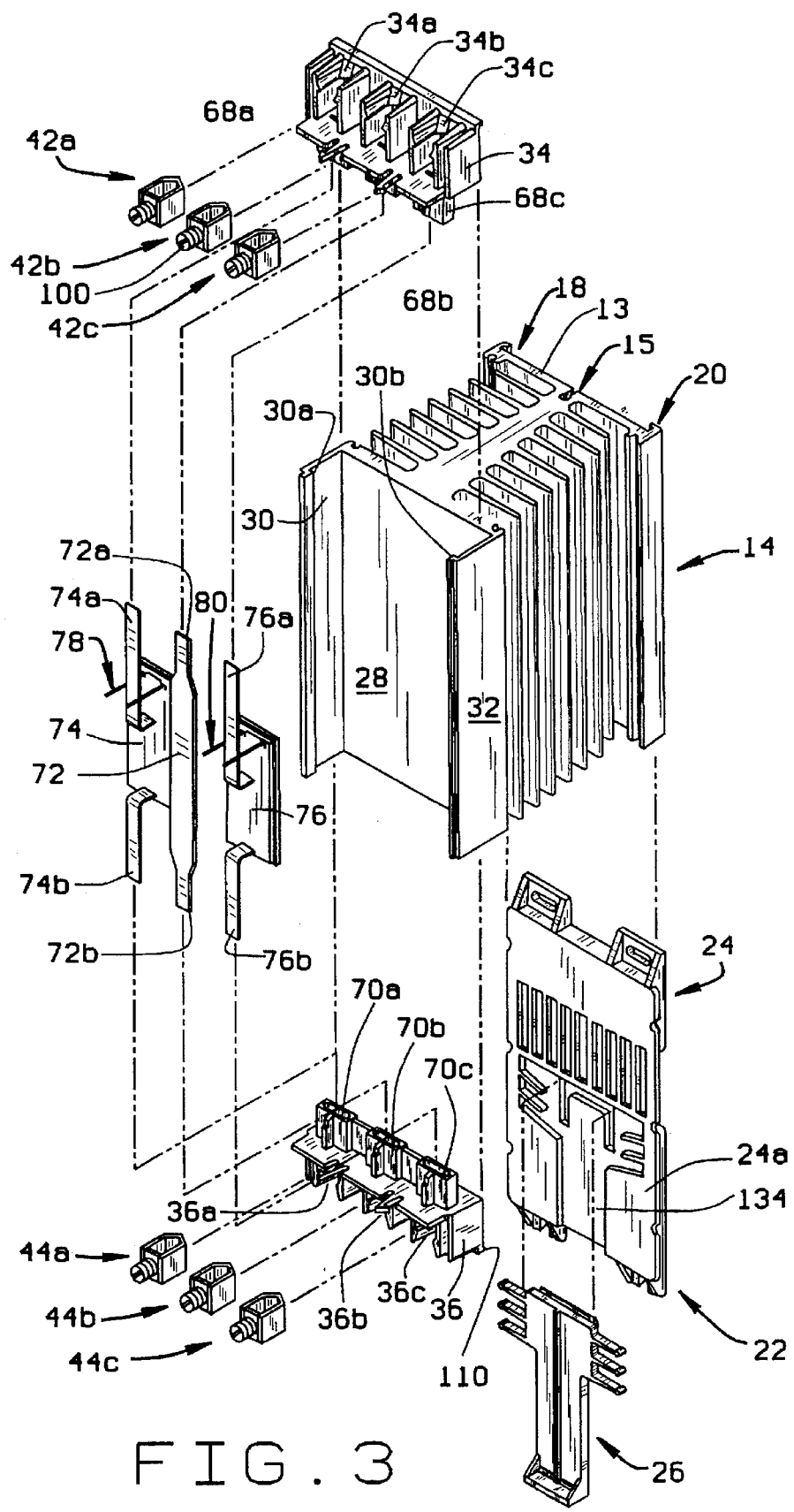
FIG. 3 illustrates an exploded isometric view of the heat sink and its corresponding numbers.

FIG. 2 illustrates an exploded view of the power control system 10 where all numerals correspond to those elements previously described. The heat sink 14 includes a forward planar panel 28 and side members 30 and 32 extending perpendicularly from the forward planar panel 28 as well as an alignment groove 15 located on the rear planar panels as illustrated in FIG. 3. Channel edge members 30a and 32a align at the forward edge of the side members 30 and 32 respectively to partially capture multipurpose potting dams 34 and 36. The potting dams 34 and 36 also house compression terminals and serve as supports for bus bars as described later in detail. A circuit board 38 aligns to the edges of the potting dams 34 and 36. A plurality of upper and lower compression terminals 42a–42c and 44a–44c align in regions in the upper and lower potting dams 34 and 36 respectively. A plurality of orifices 46a–46c and 48a–48c in the large cover 12 align correspondingly with the compression terminals 42a–42c and 44a–44c so that a screw driver or other suitable tool is given access for tightening or loosening of the compression terminals 42a–42c and 44a–44c. These orifices and associated members are later described in detail. Orifices 50a–50c in the small cover 16 align with orifices 48a–48c in the large cover 12 should access be desired without removal of the small cover 16. A plurality of slots 52a–52c in the top surface 12b of the large cover 12 and a plurality of corresponding slots 53a–53b of FIG. 4 in the bottom surface 12e align with the compression fittings 42a–42c and 44a–44c correspondingly for entry of externally routed wires held in the compression terminals 42a–42c and 44a–44c correspondingly for entry of externally routed wires held in the compression terminals 42a–42c and 44a–44c. Female latch members 54a–54b and 55a–55b of a hook and latch scheme align in the front cover in near juxtaposition with orifices 46a–46c and 48a–48c respectively for subsequent engagement with male hook members extending from the potting dams 34 and 36 as later described in detail. Orifices 56a–56b accommodate LED's of the circuitry of FIG. 23a–23b. Rectangular orifices 58a and 58b accommodate connector blocks mounted to pads 60 and 61 of the circuit board 38 each having connection terminals as described later in detail. Connector blocks mounted on pads 60a and 60b protrude through the orifices 58a and 58b so that external control wires can be readily and simply connected to the circuit board 38. These control wires are routed through a plurality of slots 62a–62c in the small cover 16. Latch slots 66a–66b are provided in the large cover 12 for engagemental contact with hook members 64a–64b of the small cover 16. Escutcheon plates 67 and 69 are provided for covers 16 and 12 respectively.

FIG. 3 illustrates an exploded isometric view of the members associated with the heat sink where all numerals correspond to those elements previously described. Illustrated in particular are bus bars whose ends secure through a plurality of alignment ports 68a–68c in the potting dams 34 and 36. A central bus bar 72 having ends 72a and 72b aligns between alignment ports 68b and 70b. SCR's 74 and 76 include bus bar members 74a–76b and 76a–76b respectively whose ends align through alignment ports 68a and 70a and alignment ports 68c and 70c respectively. Compression terminals 42a–42c align in compartments 34a–34c of the upper potting dam 34 to accommodate bus bar ends 74a, 72a and 76a as well as heavy duty wires leading to the voltage source. Compression terminals 44a–44c align in compartments 36a–36c of the lower potting dam 36 to accommodate bus bar ends 74b, 72b and 76b as well as heavy duty wires leading to an external heating element. Sets of control leads 78 and 80 in the SCR's 74 and 76 respectively extend perpendicularly to connect through the back side of the circuit board 38 illustrated in FIG. 2. Also illustrated in the FIG. is the back plate 24 which slidingly engages the channel members 18 and 20 located in the rear planar panel 13 at the rear edge of the heat sink 14 and the moveable slider 26 which aligns in a shallow "T" shaped recess 134 in the front planar surface 24a. The back plate 24 and the moveable slider 26 are instrumental in securing the heat sink 14 and associated components to a DIN mounting rail as later described in detail. The backplate 24 also includes provisions to chassis mounting in MDR footprint.

Figure 4:
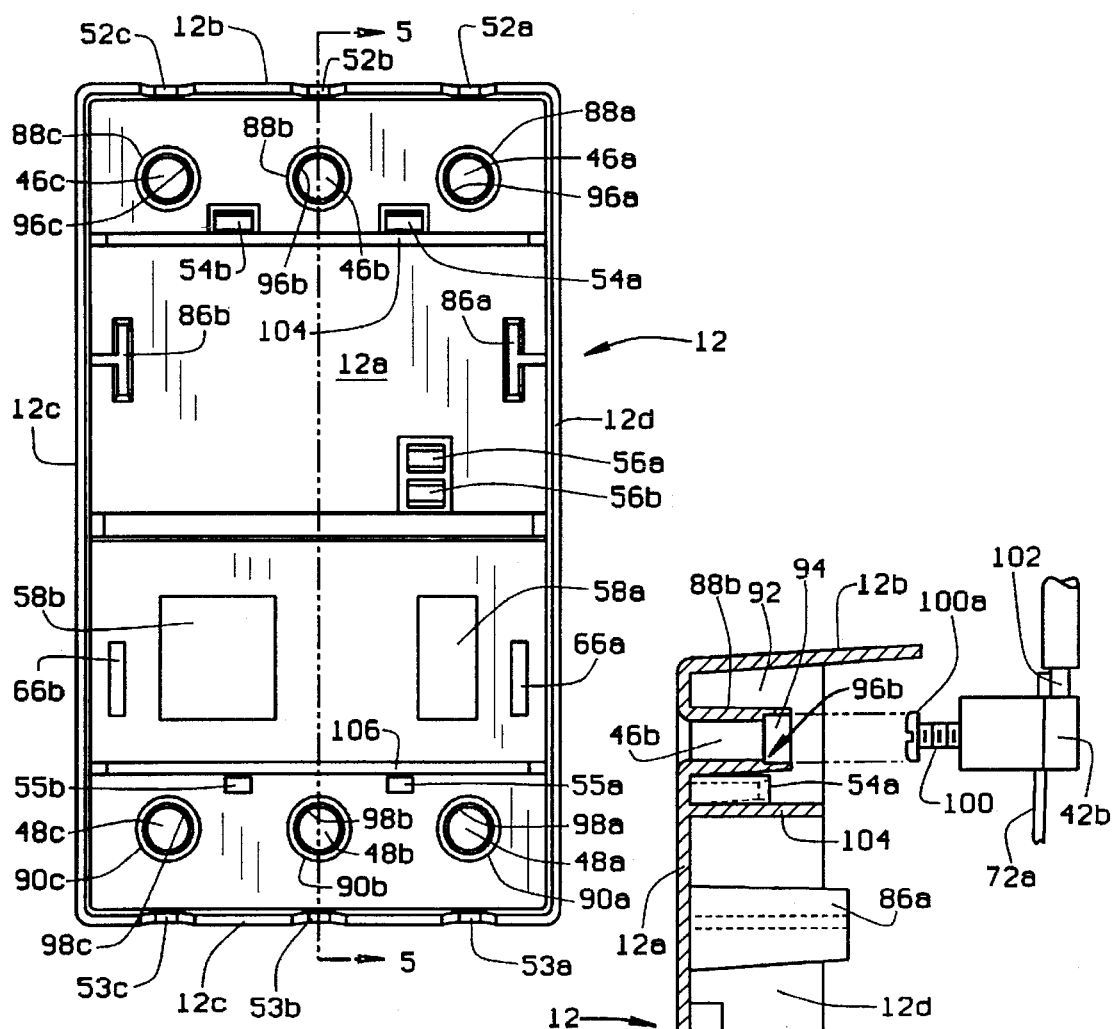
FIG. 4 illustrates a back view of the large cover.
Figure 5:
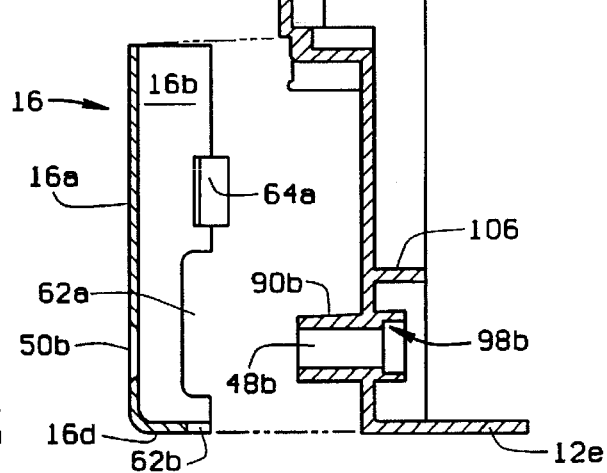
FIG. 5 illustrates a cross sectional side view of the large cover.

FIGS. 4 and 5 illustrate a back side view and a cross section view of the large cover 12 and a cross sectional side view of small cover 16 where all numerals correspond to those elements previously described. FIG. 5 is a cross sectional view through line 5—5 of FIG. 4. The small cover 16, shown in a central cross section view, includes a planar member 16a, slides 16b and 16c and a bottom member each extending essentially perpendicularly from the planar member 16a as also illustrated in FIG. 2. The front cover 12 includes a stepped planar member 12a having side members 12c and 12d, and a bottom member 12e extending essentially perpendicularly from the stepped plane member 12a. Additional members located on the stepped planar member 12a are the female latch members 54a–54b, orifices 56a and 56b, rectangular orifices 58a–58b, female latch members 55a and 55b, and support members 86a and 86b extending from the planar member 12a. Support members 86a and 86b exert minor force upon the circuit board 38 of FIG. 2 to fully engage the circuit board against the vertical edges of the potting dams 34 and 36. Orifices 46a–46c and 48a–48c are formed in multi-radius integral tubular structures 88a–88c and 90a–90c respectively which intersect the stepped planar member 12a. Integral tubular structures 88a–88c and 90a–90c each have a small and a large radius bore 92 and 94 respectively as illustrated in FIG. 5, and an annular shoulder therebetween illustrated as shoulders 96a–96c and 98a–98c in the tubular structures 88a–88c and 90a–90c respectively. The large radius 94 accommodates an appropriately sized screw head 100a such as used in the compression fitting 42b. The shoulder 96b as well as the other shoulders of the present invention prevent the screw head 100a of the screw 100 from being fully and inadvertently unscrewed from the main body of the compression terminals such as terminals 42a–42c and 44a–44c. A wire 102 and bus bar end member 72a are illustrated in a secured position in the compression terminal 42b. The orifices 46a–46c and 48a–48c contained in the tubular structures 88a–88c and 90a–90c respectively ensure alignment and positive engagement of a screwdriver with the screws of the compression terminals. Internal baffles 104 and 106 extend along the stepped planar member 12a between sides 12c and 12d.

Figure 6:
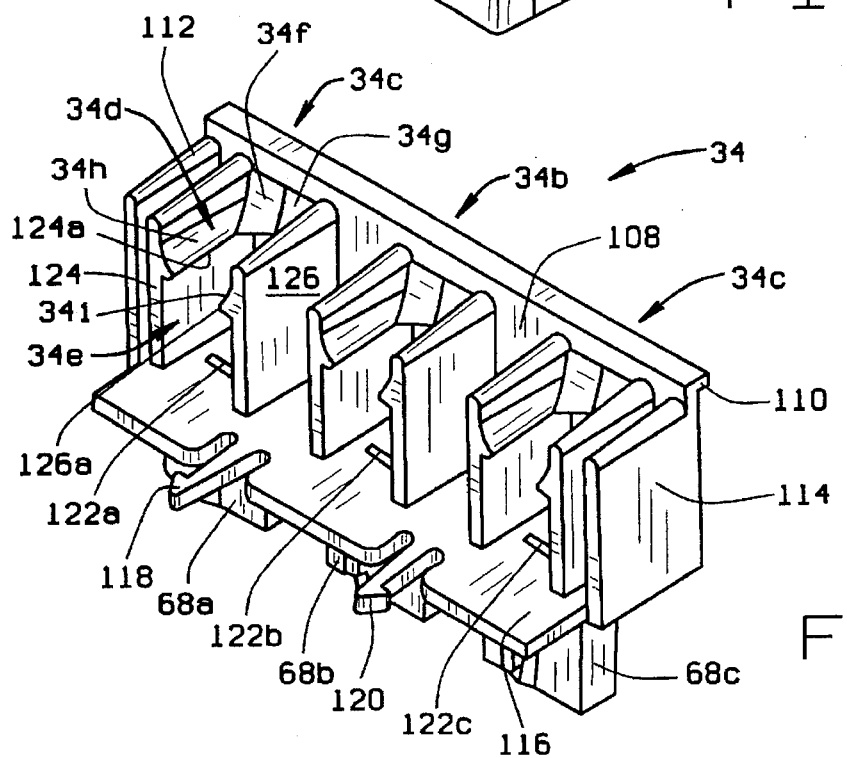
FIG. 6 illustrates an isometric view of a potting dam.
Figure 7:
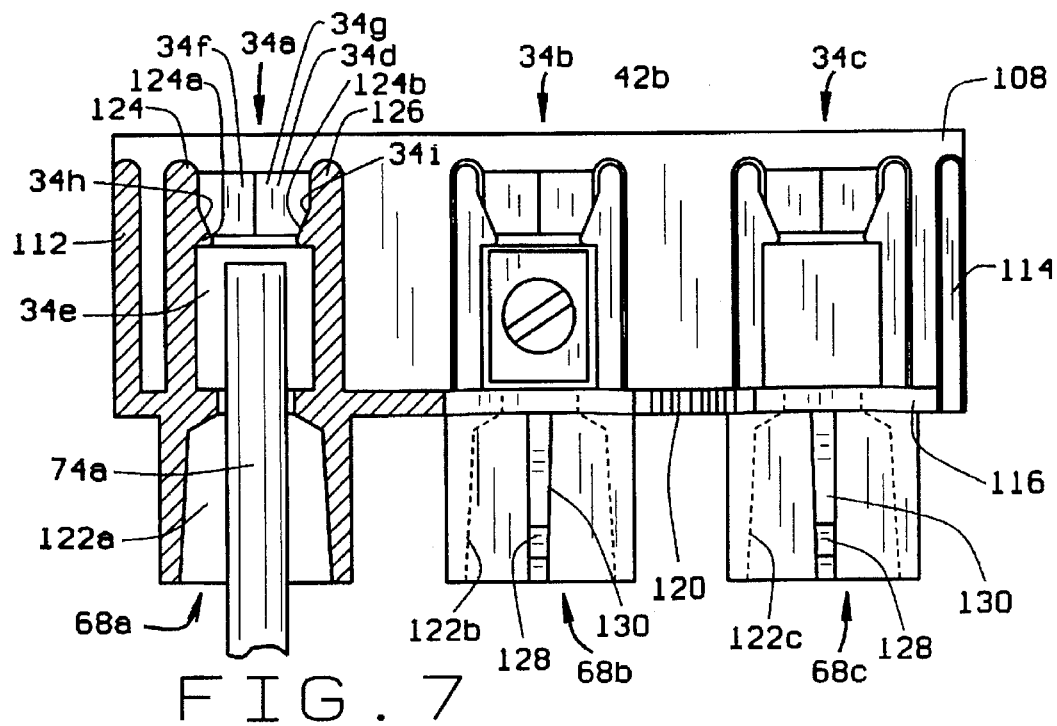
FIG. 7 illustrates a side view in partial cross section of a potting dam.
Figure 8:
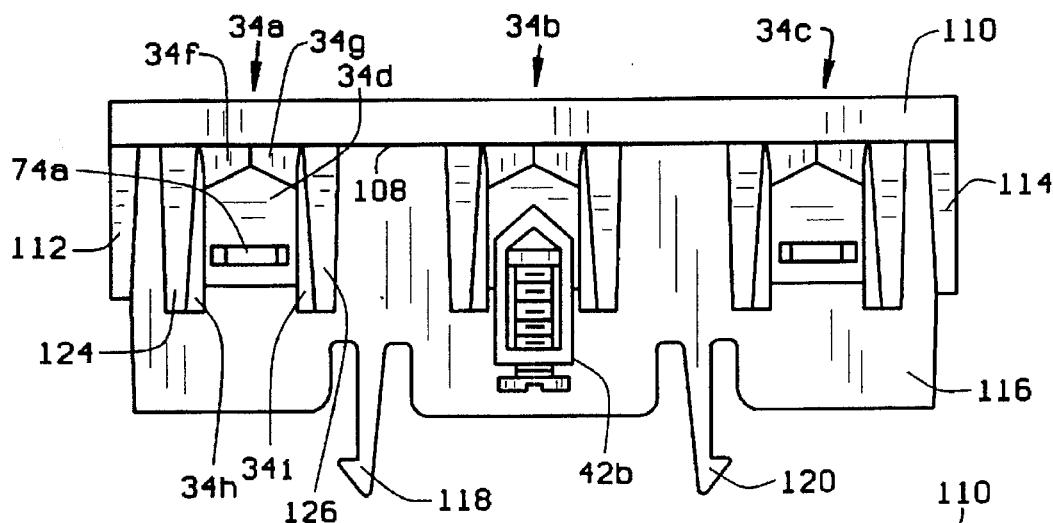
FIG. 8 illustrates a top view of a potting dam.
Figure 9:
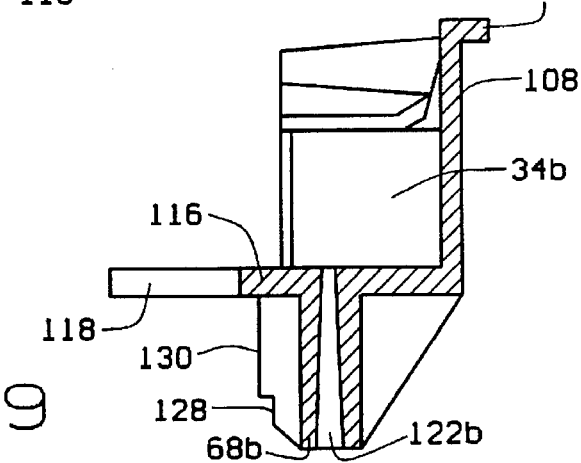
FIG. 9 illustrates a cross sectional side view of a potting dam.

FIG. 6 illustrates an isometric view, FIG. 7 illustrates a side view in partial cross section, FIG. 8 illustrates a top view, and FIG. 9 illustrates a cross sectional side view, of a potting dam 34 in a mirror-like fashion between side members 30 and 32 of FIG. 2, and which are partially secured by channel edges 30a and 32a where all numerals correspond to those elements previously described. The potting dam 34 includes a planar member 108 having a lip 110 along its upper edge, sides 112 and 114, a planar member 116, spring hook members 118 and 120 extending from the planar member 116, alignment ports 68a–68c extending downwardly from the planar member 116, and compartments 34a–34c aligned perpendicularly to the planar member 108 and the planar member 116. The alignment ports 68a–68c include tapered orifices 122a–122c which aid in insertion of the top of a bus bar such as bus bar member 74a into the compartments 34a–34c where compression terminals such as compression terminals 42a–42c clampingly accommodate the bus bar members. The compartment 34a similar to the other such compartments is now described. Opposing like vertical members 124 and 126 having horizontally aligned channel members 124a and 126a align to planar members 108 and 116 to form a four wall open compartment having an upper and lower chamber area 34d and 34e respectively. The lower chamber 34e houses a compression terminal 42a illustrated in FIG. 3 which is similar to the compression terminal 42b shown in FIG. 7.

FIGS. 6, 7 and 8 illustrate the upper chamber 34d that includes downwardly ramped surfaces 34f and 34g between the planar member 108 and upper portions of vertical members 124 and 126 as well as ramped surfaces 34h and 34i bridged between the upper inner side walls of the vertical members 124 and 126 and the channel members 124a and 126a respectively. These ramped surfaces 34f–34i aid and guide external wires into the compression terminals.

FIGS. 7 and 9 illustrate a circuit board mounting pad 128 common to all aligned ports 68a–68c and 70a–70c and is provided to mount the circuit board 38. Raised planar portions 130 engage slots in the circuit board 38 to align the circuit board between the potting dams 34 and 36.

Figure 10:
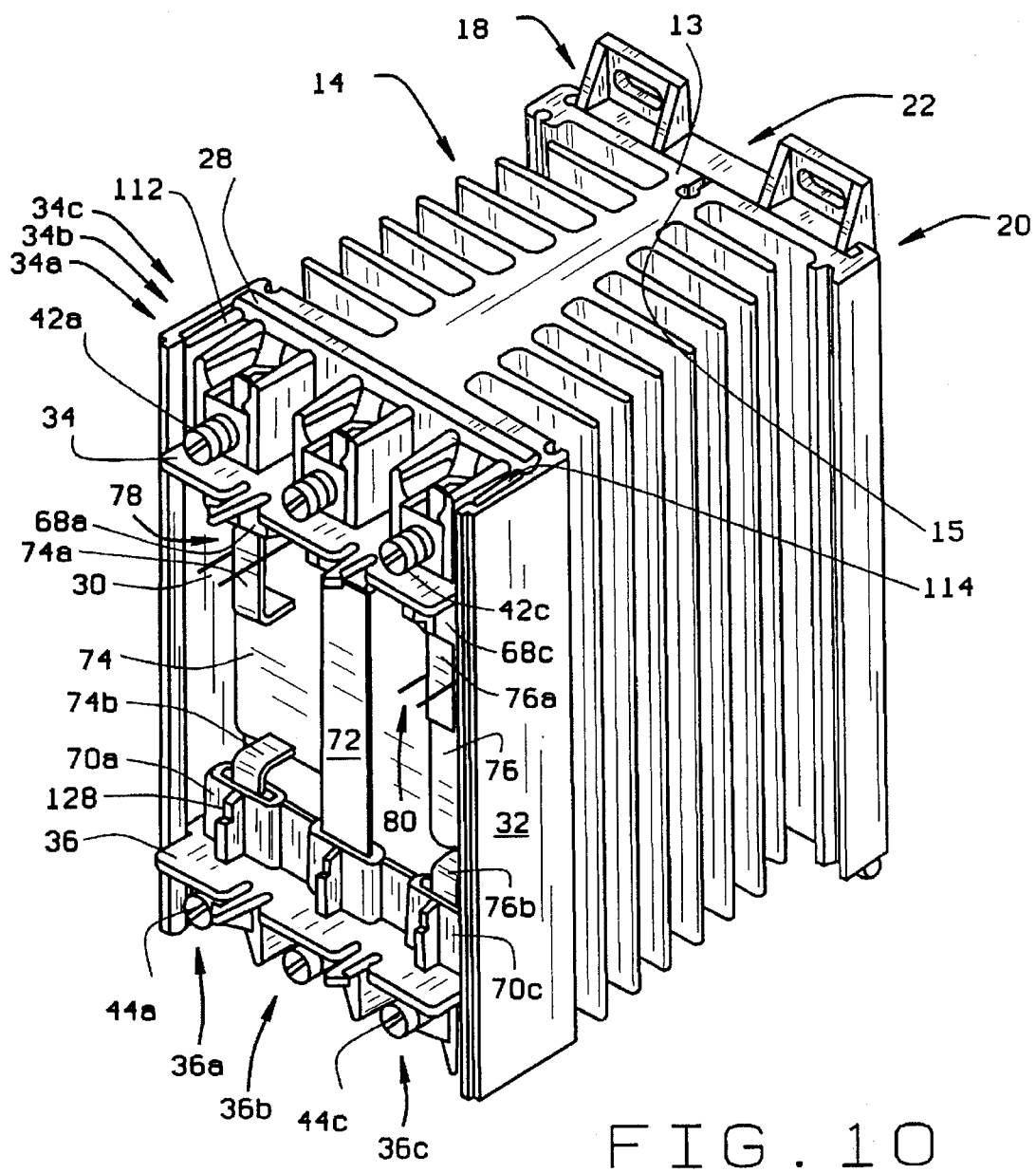
FIG. 10 illustrates an isometric view of the heat sink and bus bar enclosure area.

FIG. 10 illustrates an isometric view of the heat sink 14 and bus bar enclosure area. A potting compound is used to conduct component heat to the heat sink 14, and fills the area bounded by the potting dams 34 and 36, the side members 30 and 32 and the forward planar panel 28 of the heat sink 14. The potting compound covers the vertically aligned surfaces of the alignment ports 68a–68c and 70a–70c and leaves the circuit board mounting pads 128 clear for mounting of the circuit board.

Figure 11:
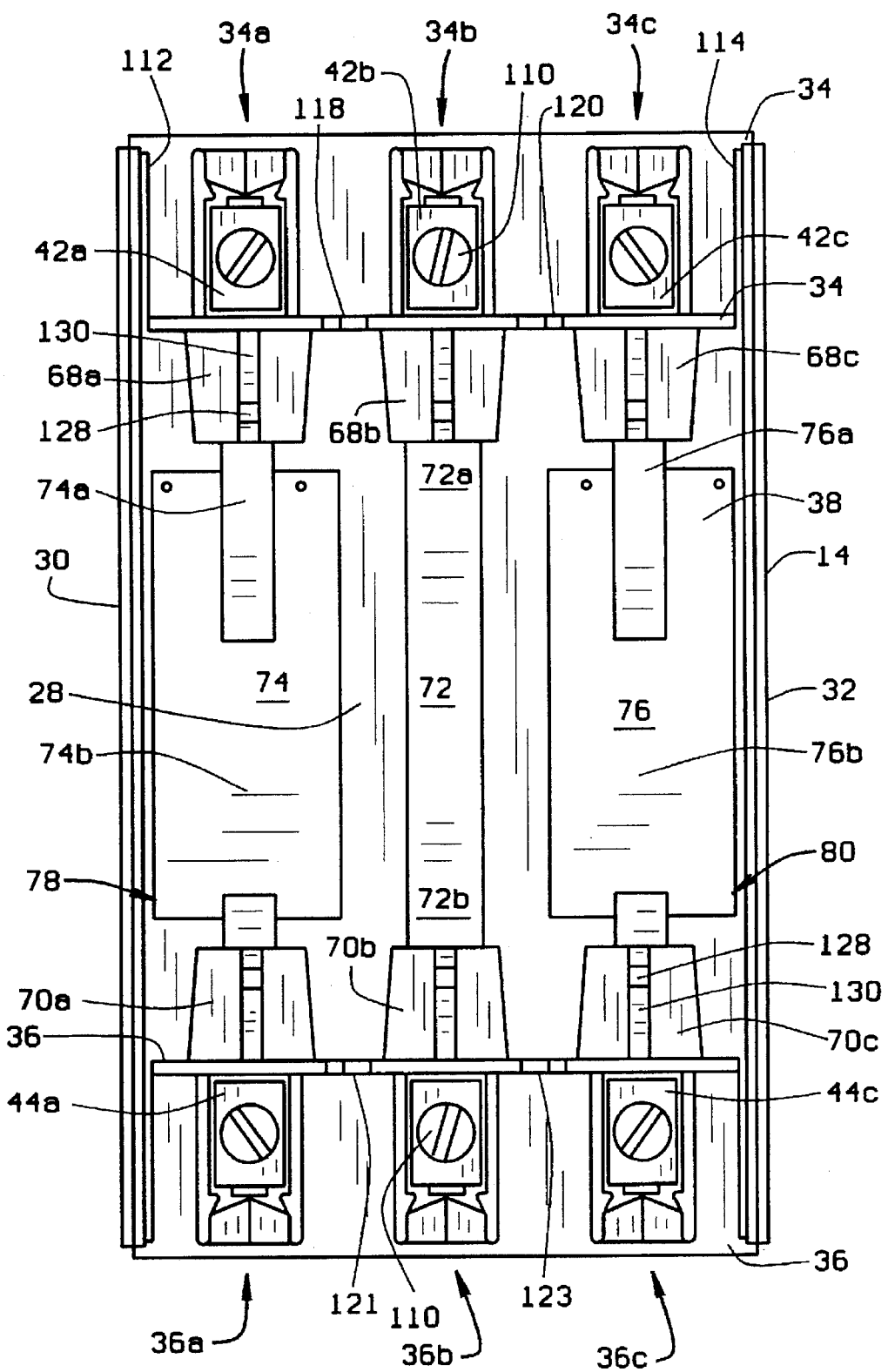
FIG. 11 illustrates a front view of the potting dams located on the forward portion of the heat sink.

FIG. 11 illustrates a front view of the heat sink 14 and the potting dams 34 and 36 where all numerals correspond to those elements previously described. Illustrated in particular is the relationship of the bus bars and other circuitry items with regard to the potting dams 34 and 36. Switching circuits 74 and 76 are in direct contact with the forward planar panel 28 of the heat sink 14, and are connected by their appropriate bus bars 74a–76b and 76a–76b respectively to the compression terminals 42a and 42c and compression terminals 44a and 44c. The process of capturing the compression terminals 42a–42c and 44a–44c provides support for torque due to wire attachment and prevents the transfer of stress to the switching circuit substrates 74 and 76. The potting dams 34 and 36 interact with the heat sink 14 to capture the potting dams from five directions of movement as well as potting dam interaction with the large cover 12 to capture the sixth direction of movement. Capture is provided as follows:

1. The potting dams 34 and 36 are captured on one side by the forward planar panel 28.
2. The potting dams 34 and 36 are captured on opposing sides by side members 30 and 32.
3. The potting dams 34 and 36 are captured by contact of the edges of sides 112 and 114 with the channel edges 30a and 30b.
4. The potting dams 34 and 36 are captured by the lip 110 engaging the edges of the forward planar panel 28.
5. The potting dams 34 and 36 are mutually captured by engagement of bus bars 72, 74a, 74b, 76a, 76b with the compression connectors 42a–42c and 44a–44c housed in the compartments 34a–34c and 36a–36c of potting dams 34 and 36.
6. The large cover 12 engages the hooks 118, 120, 121 and 123 extending vertically through orifices 54a, 54b, 55a and 55b of the large cover 12.

Figure 12:
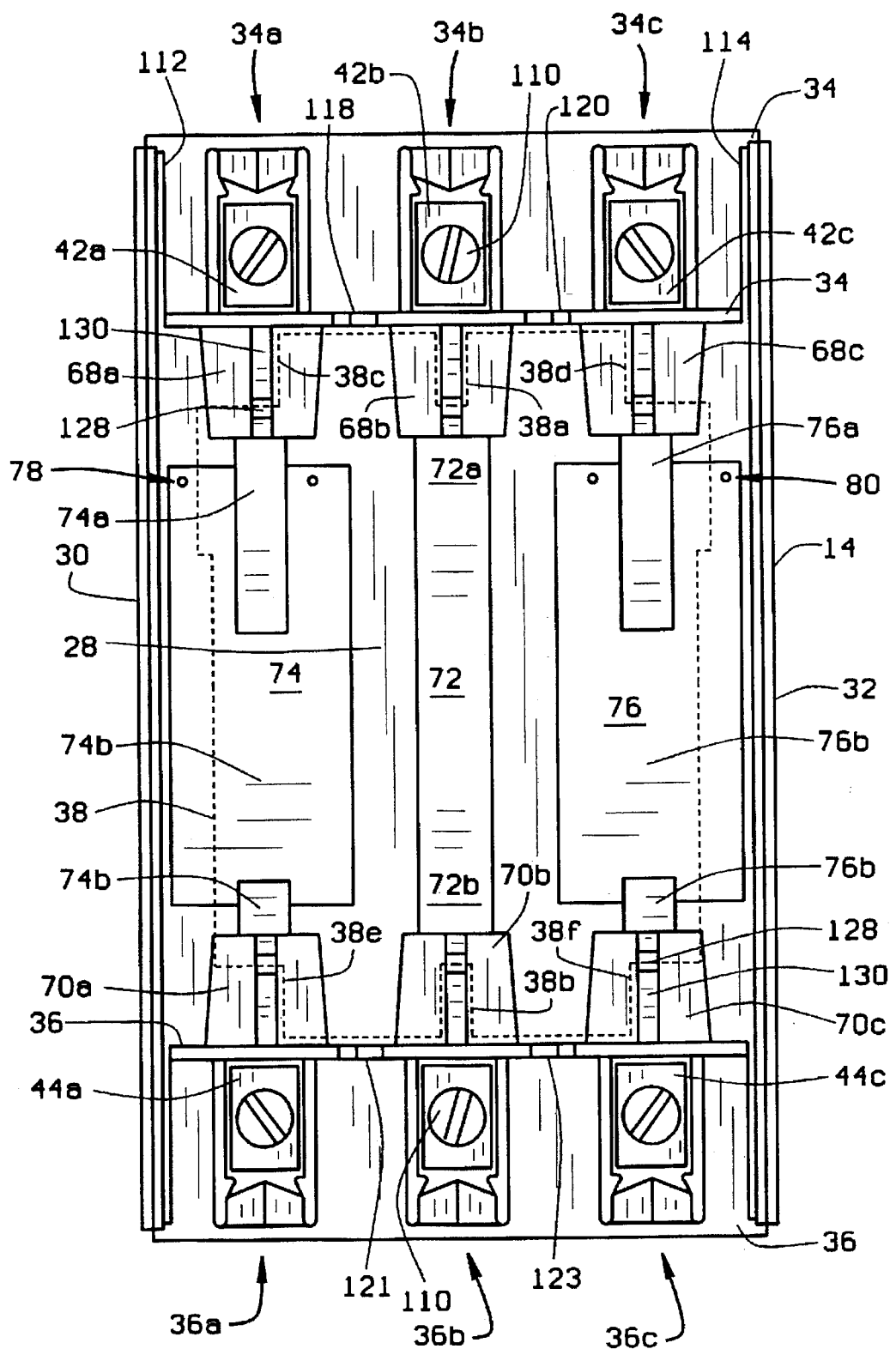
FIG. 12 illustrates the alignment of the circuit board between the potting dams.

FIG. 12 illustrates the alignment of the circuit board 38, shown in dashed lines, between the potting dams 34 and 36 where all numerals correspond to those elements previously described. The raised planar portions 130 of the ports 68a–68c and 70a–70c being aligned perpendicularly and vertically with respect to the alignment ports 68a–68c and 70a–70c, serve as indexing guides with circuit board slots 38a and 38b and also with circuit board edges 38c–38f. The board 38 rests on the plurality of circuit board mounting pads 128 located on the plurality of raised planar members 130.

Figure 13:
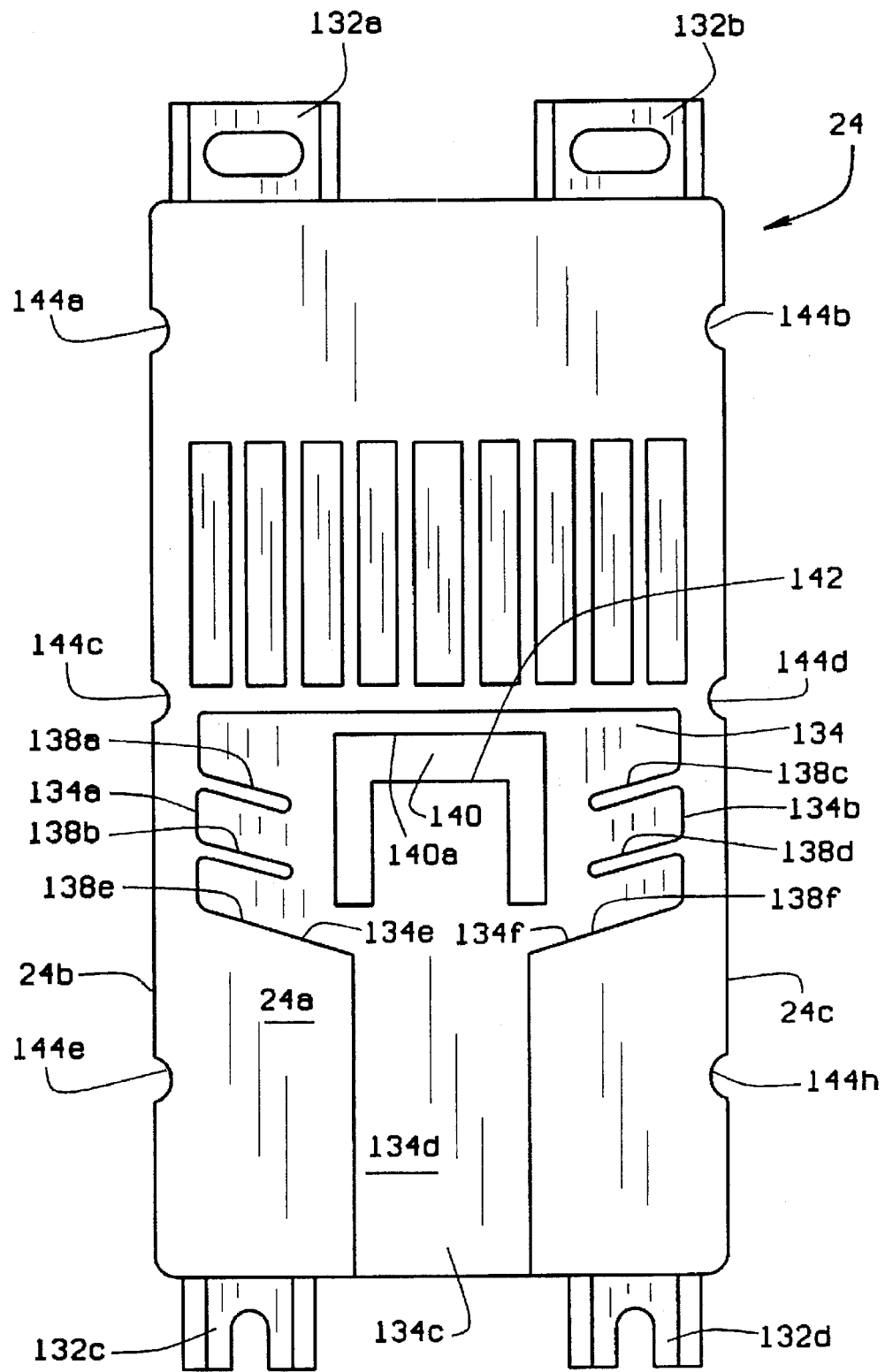
FIG. 13 illustrates a front view of the back plate.
Figures 14, 15:
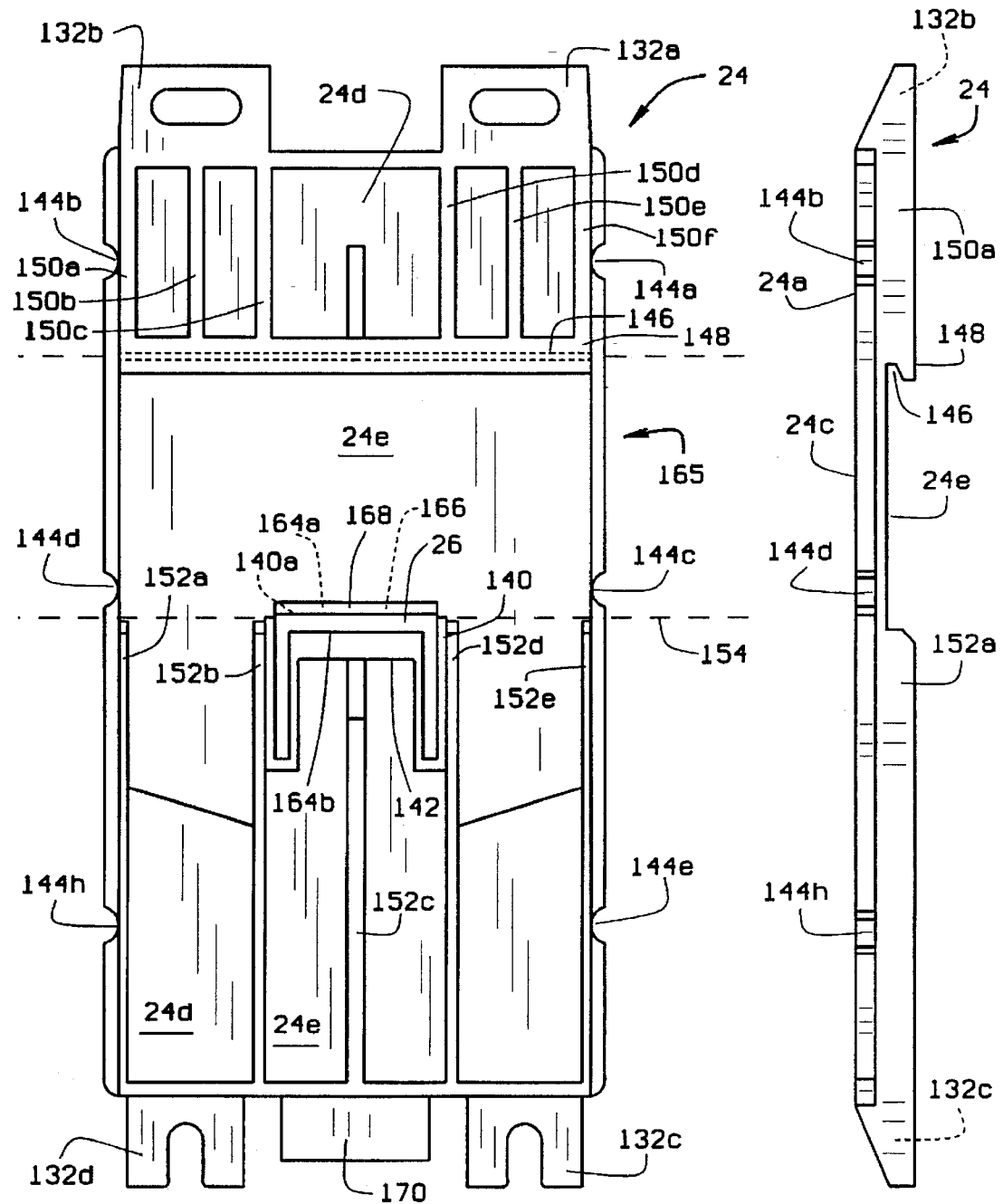
FIG. 14 illustrates a rear view of the back plate.
FIG. 15 illustrates a side view of the back plate.

FIG. 13 illustrates a front view of the back plate 24 where all numerals correspond to those elements previously described. The back plate 24 being essentially planar and includes edges 24b and 24c at the sides of a front planar surface 24a, closed slotted mounting tabs 132a–132b and upon slot mounting tabs 132c–132d for mounting to a planar surface. A DIN mounting slot is illustrated later in detail. A "T" shaped recess 134 aligns into surface 24a for accommodation of a slider 26 illustrated in FIG. 16. Rib like extensions having surfaces 138a and 138b extend at a downward angle from the side wall 134a of the recess 134 and riblike extensions having surfaces 138c–138d extend at a downward angle from the side wall 134b of the recess 134. Corresponding angled surfaces 138e and 138f are located on the side walls 134e and 134f of the "T" shaped recess 134. The lower end 134c of the "T" shaped recess 134 is open to allow fitting of the slider 126 into the "T" shaped recess 134. A "U"-shaped cutout 140 is located at the upper portion of the "T" shaped recess 134 to accommodate a portion of the slider member 26. A stop bar 142, being integral to the back surface 134d of the recess 134, forms one portion of the "U" shaped cutout 140 and serves to limit travel of the slider 26 as can be seen in FIG. 14. Semicircular recesses 144a–144n accommodate surface mounting of the back plate 24.

FIG. 14 illustrates a rear view of the back plate 24 with a moveable slider 26 in position in the "T" shaped recess 134 of the opposite side of the back plate 24 where all numerals correspond to those elements previously described. A "V" groove 146 underlies a first raised planar surface 148 aligned at the end of ribs 150a–150f. A second raised planar surface 24e is located adjacent to the "V" groove 146. Ribs 152a–152e extend perpendicularly from a third rear planar surface 24d and from a second planar surface 24e. The upper ends of the ribs 152a, 152b, 152d and 152e, serve as alignment guides for a DIN rail 154 shown in dashed lines.

The upper edge of the DIN rail 154 engages the "V" groove 146 and a latch surface 166 of the moveable slider 26 engages the lower edge of the DIN rail 154 as also described later in detail. DIN rail 154 is captured by the "V" groove 146 and the slider 136 and the second raised planar surface 24e. The DIN slot 165 includes the "V" groove 146, the second raised planar surface 24e and the latch surface 166.

FIG. 15 illustrates a side view of the back plate 24 where all numerals correspond to those elements previously described.

Figure 19:
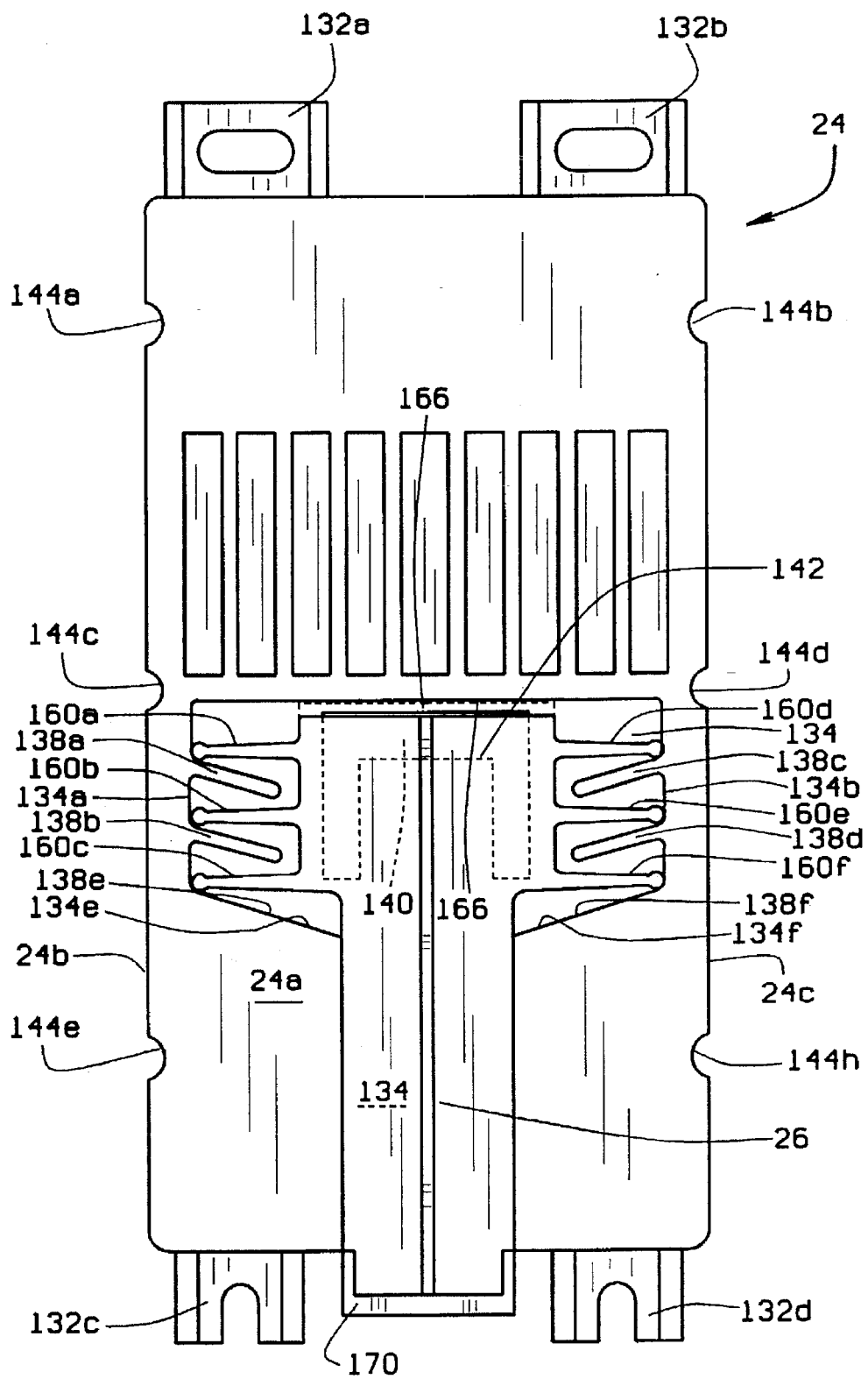
FIG. 19 illustrates the moveable slider aligned in the "T" shaped recess.

FIG. 16 illustrates an isometric view of the moveable slider 26 preferably of flexible plastic or other suitable material where all numerals correspond to those elements previously described. A plurality of flexible spring beams 160a–160f extend perpendicularly from the upper portion of the body 162 to engage surfaces 138a–138f extending into the "T" shaped recess 134 in the back plate 24 as illustrated in FIG. 19. A supported bar member 164 having an upper planar surface 164a extends perpendicular to the upper portion of the body 162 to support a latch surface 166 which includes an adjacent ramped surface 168. A supported manual actuator tab 170 is provided at the lower end of the body 162. An alignment ridge 172 extends vertically along one side of the body 162 for subsequent alignment with the alignment groove 15 on the rear planar panel 15 of the heat sink 14.

FIG. 17 illustrates a front view of the moveable slider 26 where all numerals correspond to those elements previously described.

FIG. 18 illustrates a side view of the moveable slider 26 where all numerals correspond to those elements previously described.

FIG. 19 illustrates the moveable slider 26 aligned in the "T" shaped recess 134 where all numerals correspond to those elements previously described. The moveable slider 26 is illustrated in the position where the DIN rail is normally captured. The ends of the spring beams 160a–160f align against the surfaces 138a–138f as illustrated. Actuation of the actuator tab 170 downwardly causes the spring beams 160a–160e to flex upwardly and be loaded so that a DIN rail can be captured or released by the latch surface 166. In the normal and latched position the upper planar surface 164a of the supported bar member aligns against the upper surface 140a also illustrated in FIG. 14. When full flexure of the spring beams 160a–160f is accomplished by full actuation of the actuator tab 170 the flexure travel is limited by contact of the lower planar surface 164b of the supported bar member 164 with the stop bar 142 each of which is illustrated in FIG. 14. Interaction between the backplate 24 and the moveable slider 26 achieves a spring loaded locking mechanism with only two parts.

Mode of Operation

Figure 20:
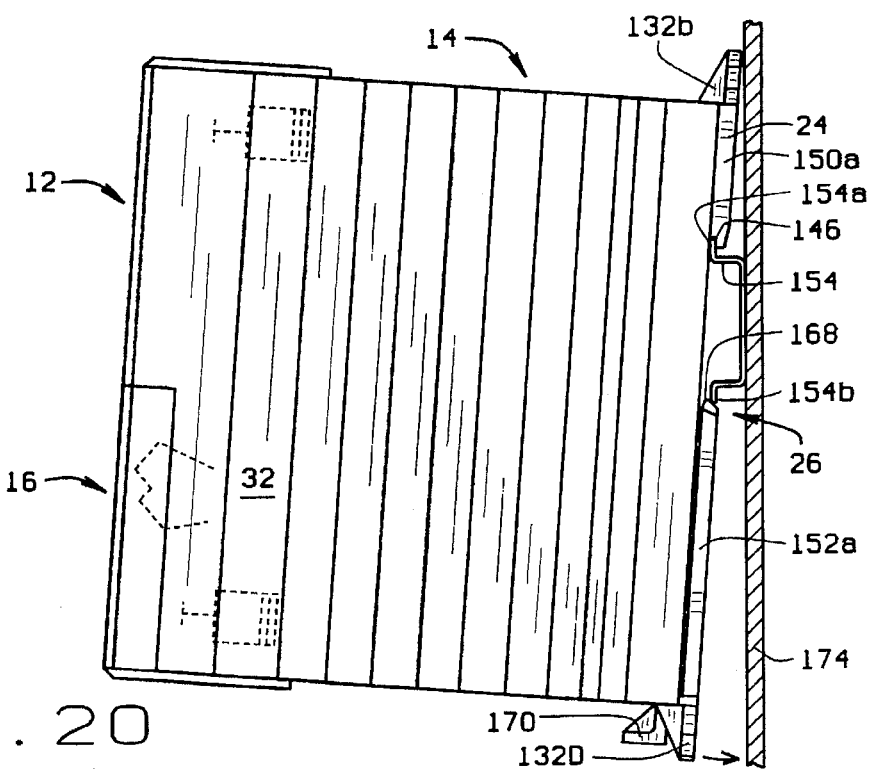
FIG. 20 illustrates the first step of the engagement of the power control system to a DIN rail.
Figure 21:
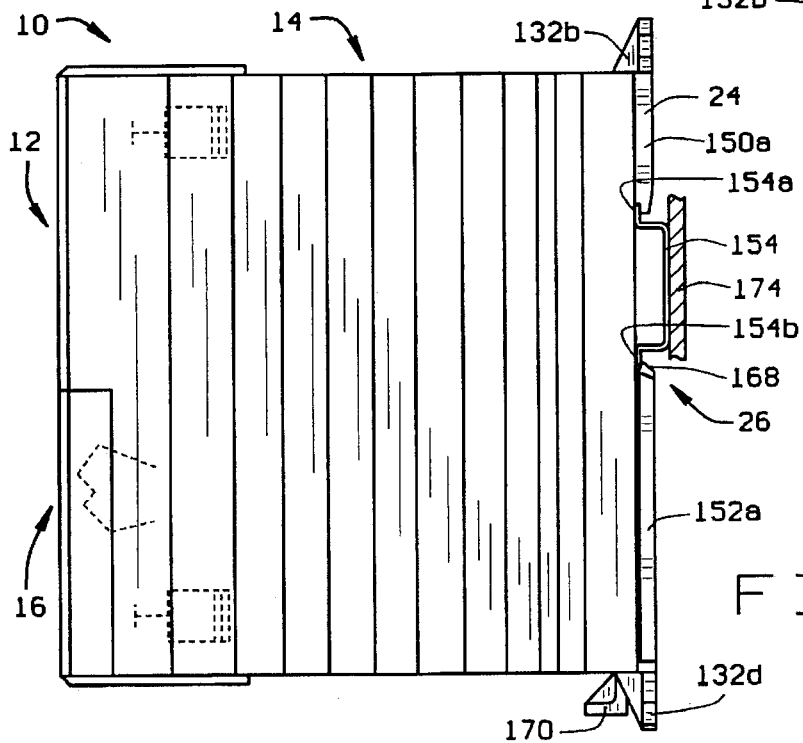
FIG. 21 illustrates a power control system completely engaged to a DIN rail.

FIG. 20 illustrates the first step of engagement of the power control system 10 to a DIN rail 154 where all numerals correspond to those elements previously described. A DIN rail 154 is illustrated as suitably attached to a planar member 174. The "V" groove 146 first is engaged about the upper member 154a of the DIN rail 154. The bottom of the power control system 10 is then rotated and moved inwardly to position the lower member 154b of the DIN rail 154 against the ramped surface 168 of the moveable slider 26. Pressure against the ramped surface 168 forces the movable slider body 162 downwardly against the spring tension afforded by the spring beams 160a–160f until the lower member 154b passes the ramped surface 168 of the movable slider 26 at which point rail capture is fully executed as the spring beams 160a–160f force the body 162 upwardly thus advancing the latch surface 166 along the back side of the lower rail member 154b. Full engagement of the DIN rail is illustrated in FIG. 21. The actuator tab 170 may be actuated for mating the back plate 24 to the DIN rail if desired. Release of the back plate 24 from the DIN rail 124 is accomplished by actuating the actuator tab 170 downwardly to allow withdrawal of the latch surface 166 from engagement with the lower DIN rail member 154b. The back plate 24 and associated components are then lifted upwardly to completely disengage from the DIN rail 154.

FIG. 21 illustrate a power control system 10 completely engaged with a DIN rail where all numerals correspond to those elements previously described.

Figure 22:
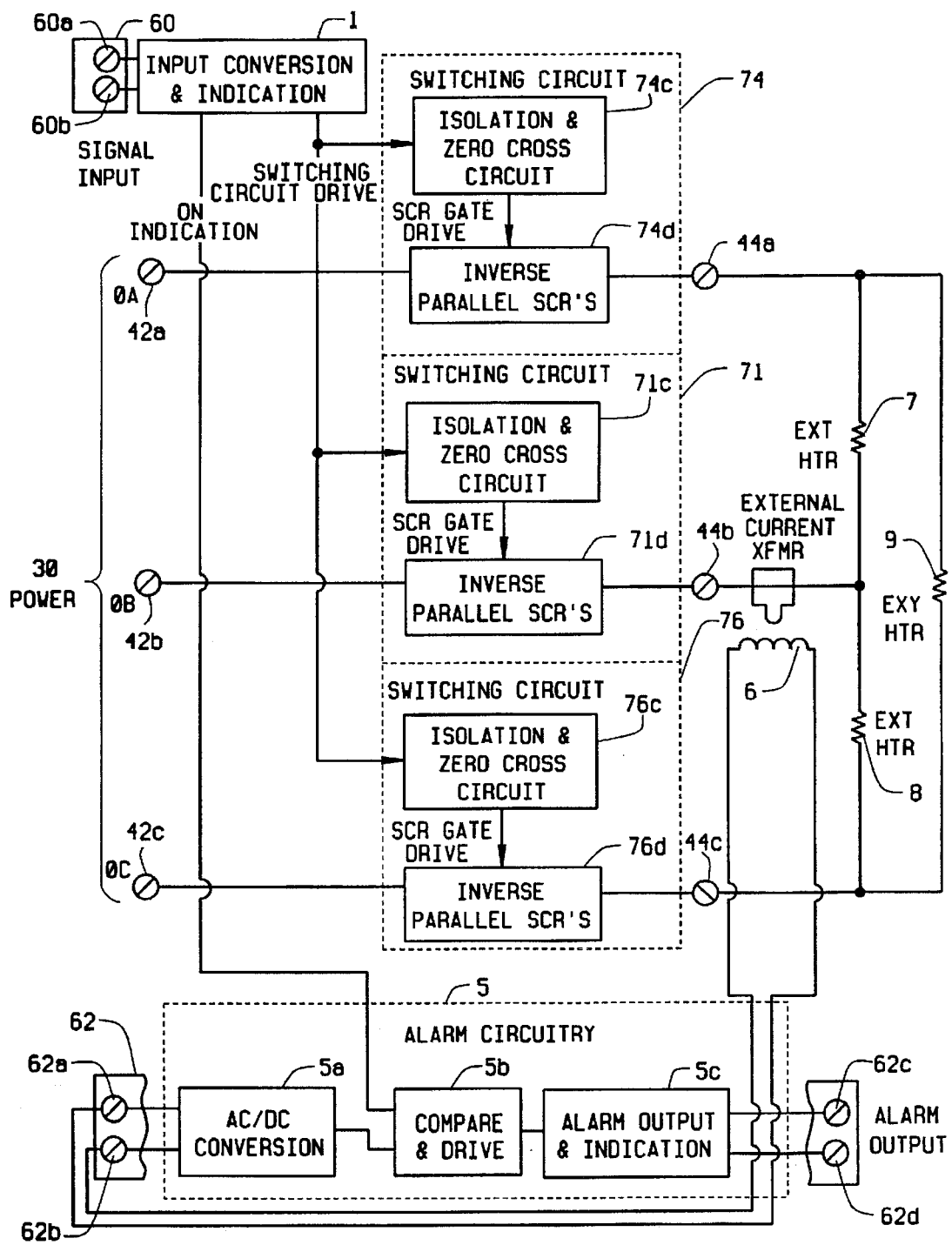
FIG. 22 illustrates a block diagram of the power control circuitry.

FIG. 22 illustrates a block diagram of the DIN mounted power control system 10 configured as a 3Ø-3 leg unit even though a 3Ø-2 leg device has been described where all numerals correspond to those elements previously described. Alternate constructions, e.g. 3Ø-2 leg and 10, can also utilized within the scope of the invention. The functions of these alternate constructions are similar to that described here with the exception to the number of active line switching elements employed.

The input conversion and indication block, 1, receives a variety of electrical inputs on terminals 60a and 60b located on pad 60. AC, DC, and process type inputs are available from an external temperature controller. This block 1 provides as outputs properly scaled DC current(s) to drive the inputs of SCR switch circuits, 74, 76 and another SCR device 71 not previously illustrated and also provides an on indication signal to the alarm circuitry, 5. A visual on indication is also provided.

Each switching circuit 74, 71, and 76, has isolation and zero-cross circuit elements, 74c, 71c, and 76c. The isolation and zero-cross elements have two functions. First, they provide electrical isolation between the high current line potentials at terminals 42a, 42b, and 42c and the external temperature controller. Second, they convert the scaled DC current(s) from the input conversion and indication block 1, into SCR gates 74, 71, and 76, to conduct—thus allowing current to flow into the external heaters, 7, 8, and 9, via interconnections the 42a–44a, 42b–44b, and 42c–44c. The SCR gate drive signals are present when the input conversion and indication block is providing the scaled DC current (s). When there are no SCR gate drive signals, the inverse parallel SCRs 74b, 71b and 76b cease conducting current into the external heaters 7–9 by returning to the blocking state.

The alarm circuit 5, provides indication of a shorted output device, i.e., shorted member(s) of switching circuit(s) by monitoring the presence of load current and the on indication signal from the input conversion and indication block 1. Load current is sensed with an external current transformer 6 which provides an AC current proportional to load current into terminals 62a and 62b located on pad 62. The AC/DC conversion element 5a converts this AC current into a DC level which is compared by the compare and drive element 5b against the on indication signal. If, after sufficient time to account for characteristic delays, the comparison shows that load current continues to flow when there is no on indication, the compare and drive element 5b sends a signal to the alarm output and indication element 5c. The alarm output and indication element 5c provides isolation between the external alarm circuit elements (e.g. ac relay coils) and the external temperature controller. The alarm output is essentially an AC switch closure across interconnections 62c and 62d on pad 62. A visual indication of the alarm state is also provided.

Figure 23:
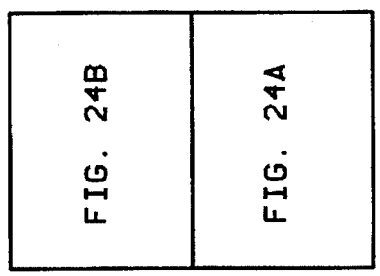
FIG. 23 illustrates the orientation of FIGS. 24A and 24B which are electronic diagrams for the power control system.
Figure 24B:
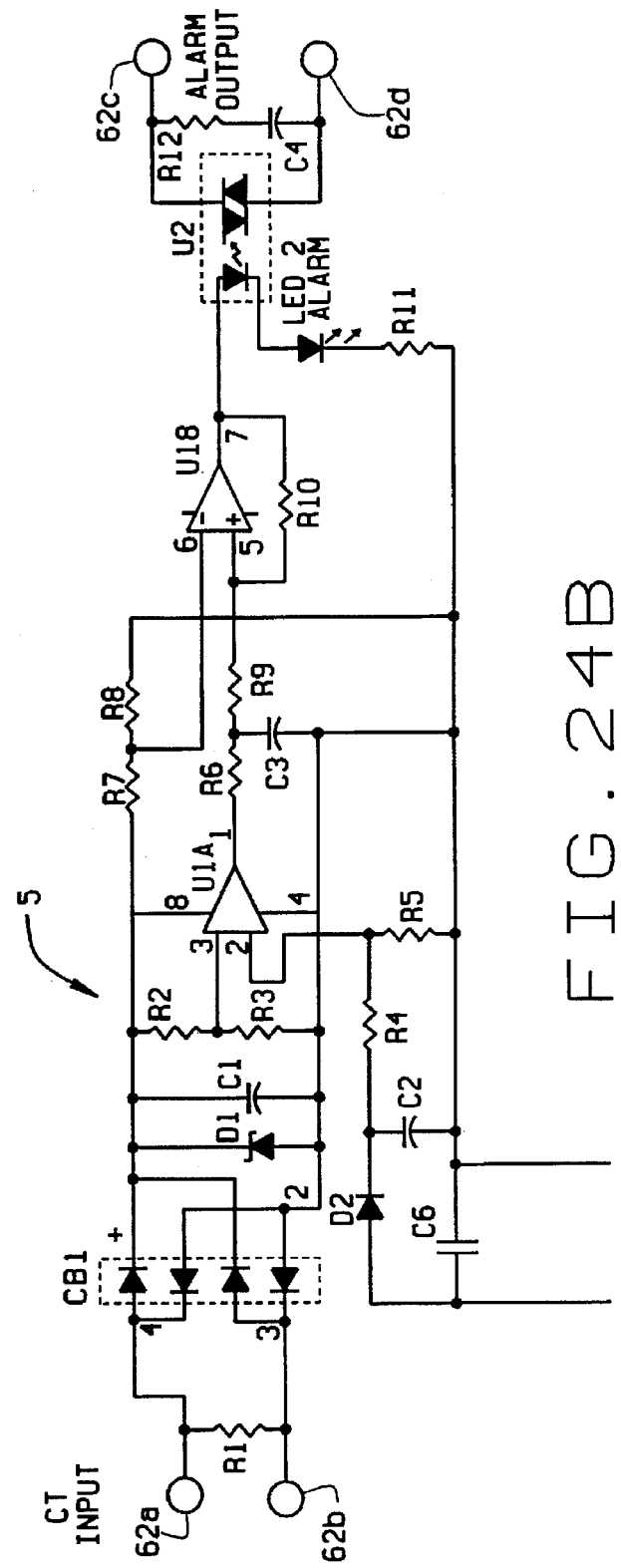
FIGS. 24A and 24B illustrate the electronic diagram of the power control system.
Figure 24A:
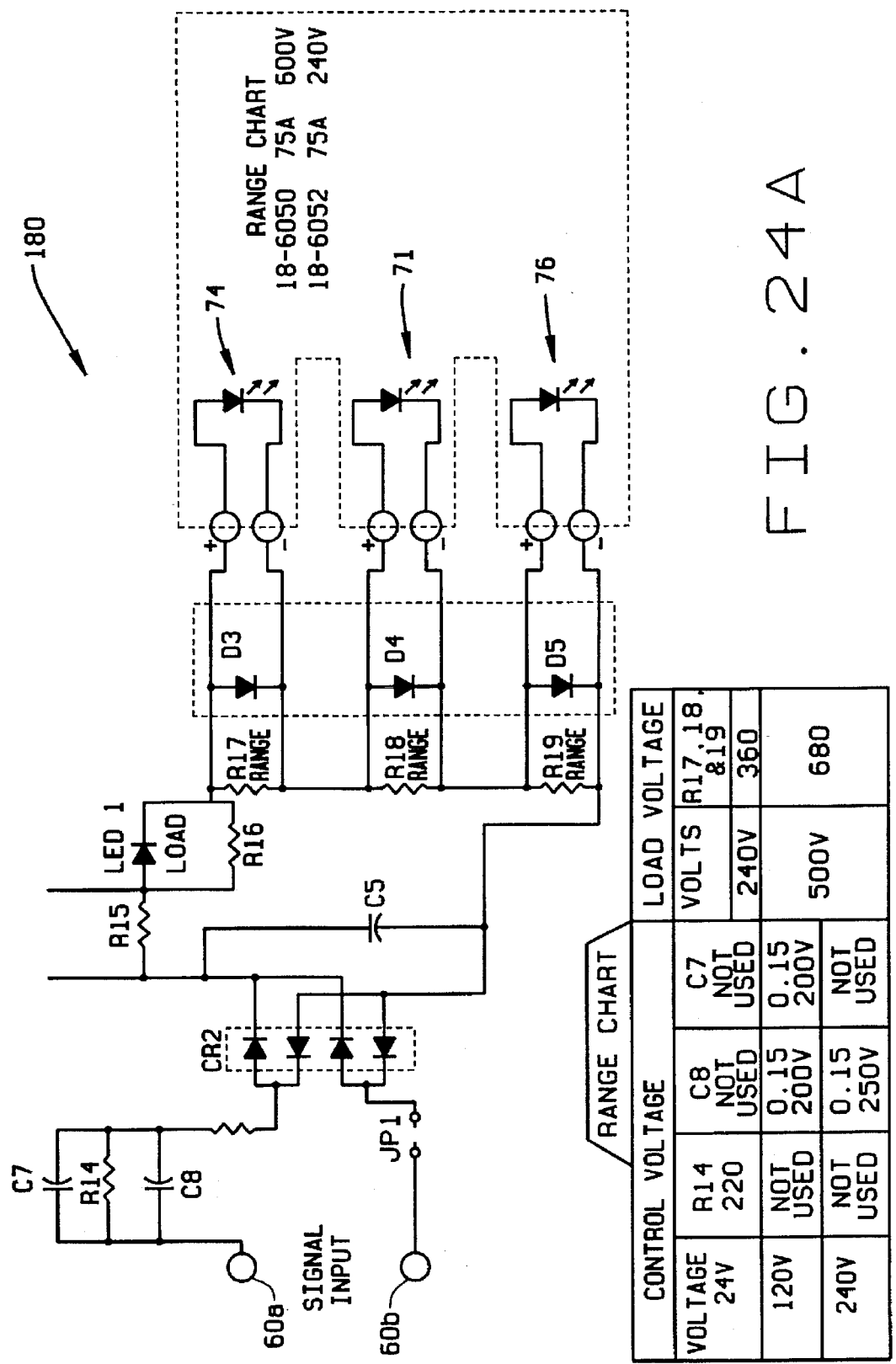

FIG. 23 illustrates the orientation of FIGS. 24A and FIG. 24B.

FIGS. 24A and 24B illustrate an electrical schematic diagram 180 of the power control system 10 where all numerals correspond to those elements previously described.

FIGS. 24A and 24B illustrate the detailed operation of the AC input including an alarm feature circuit for the power control system 10. It is considered unique in at least three major areas:

1) The input circuit emulates the operation of a contactor (mechanical or mercury displacement relay, MDR, in that it has defined "pull-in" and "drop-out" regions correlating to specific coil voltages.
2) Circuitry allows product to operate as direct replacement in applications which are driven by common solid state output devices which have a R-C "snubber" in parallel with them.
3) The ability of the circuit to provide the alarm feature with an AC input.

The following description is divided into two sections; the first section, FIG. 24A, describes the input conversion and indication block with interaction to the switching circuits the substrate assemblies, and the second section, FIG. 24B, describes the alarm circuit.

AC Input Conversion and Indication Block—FIG. 24A

This circuitry 180 is comprised of terminals 60a and 60b, R-C snubber, C7, C8, R14, R20, CR2, JP1, C5, R15, R16, LED1, R17, R18, R19, D3, D4 and D5. It interfaces with "off-board" SCR switching circuits 71, 74 and 76, the inputs for which are diagrammatically illustrated as the LED parts of the SCR assemblies.

During the on state, when an external controller is calling for heat, an equivalent switch is closed at the controller and AC voltages around the nominal values of 24, 120, or 240 vac are applied to the input of this block at terminals 60a and 60b. The equivalent switch of available external controllers are such that there is negligible voltage drop across it and therefore the full potential available is impressed across these terminals. This AC input voltage serves as a charging current source into C5 through current limiting elements C7, C8, resistors R14, R20 and full-wave bridge CR2. C7, C8 and R14 are range components matched to the line value. For 240 vac inputs only C8 is used, for 120 vac C7 and C8 are used, and for 24 vac only R14 is used.

Charge is drained from C5 in a DC manner. When the input line voltage is below 60% of its nominal value, DC current flows primarily through the resistive elements R15, R16, R17, R18, and R19. Currents are such that the voltage developed across R16, R17, R18, or R19 is not sufficient to cause the active semiconductor elements in parallel with them to conduct, meaning here that the output devices will be off and that the LED will not be illuminated. The values of R17, R18 and R19 are dependent on output line voltage as described below. For input voltages above 80% of nominal line voltage sufficient DC current (>7 mA) is caused to flow through the input of the interconnected switching circuits causing these switching circuits to cause the inverse parallel SCR elements to conduct.

R15 limits the discharge current drained from C5. The voltage developed across element R15, and noise suppression element C6 of FIG. 24B, act as the on indication to the alarm circuit.

The current through R15 continues to flow through the combination of LED1 and R16. LED1 illuminates when sufficient current exists to create a voltage across R16 sufficient to turn it on. The current through LED1 and R16 also passes through the parallel combination of R17 and D3 or an external switching circuit, D6, the parallel combination of R18 and D4 or an external switching circuit, D7, and the parallel combination of R19 and D5 or an external switching circuit. The use of D3, D4, and D5 is optional dependent on the final system configuration. In the case of 1∅ products, D3 and D5 are used and the current is routed through the central switching circuit. For 3∅-2 leg products, D4 is used and current is routed through the outermost switching circuits in parallel with D3 and D5. Finally, for 3∅-3 leg products, neither, D3, D4 or D5 are used and current is routed through all three switching circuits.

The values of R17, R18 and R19 are output voltage range dependent because the current shunting action they provide at the line voltages below the "pull-in" level must be matched to the presence of 1: (outputs up to 240 vac) or 2: (outputs up to 600 vac) semiconductor (LED) equivalent voltage drops. That is, for system output voltages up to 240 vac, R17–R19 must shunt approximately 3 mA at 1.1 VDC drop, whereas for system output voltages above 240 vac and less than 600 vac, R17–R19 shunt approximately 3 mA at 2.2 VDC drop.

When the external temperature controller senses a requirement to turn heat off, the external temperature controller opens an equivalent switch. Practical implementations of equivalent switches (generally solid state output types) have an R-C "snubber" across the external temperature controller switch. This causes the voltage applied across the input terminals 60a and 60b to be something other than zero—absolute value dependent upon the component values of the controller "snubber" and its interaction with the AC input conversion and indication circuit described here. It can be shown that the input impedance of this system and the current shunting around the active elements produces acceptable performance in this regard. Key to successful operation is the matching of the current shunting elements R17–R19 and the range values of C7 (240 vac), C7 and C8 (120 vac), and R14 (24 vac) to the input line voltage.

The final element of this loop is JP1. JP1 provides means of interconnecting the bimetal thermostat switch into the circuit. This thermostat switch opens if the SCR junction temperature exceeds a safe level. When the switch opens all current through the loops identified above ceases and the inverse parallel SCR circuits are commanded to be off. This thermostat is used when a fan is mounted to the heatsink and is used to detect fan failure or blockage. With no fan, the thermostat switch is replaced by a shorting jumper.

Alarm Circuit—FIG. 24B

The alarm circuit 5 of FIG. 24B is comprised of terminals 62a–62d, R1, CR1, C1, D1, R2, R3, D2, C2, R4, R5, U1A, R7, R6, C3, R8, R9, U1B, R10, U2, LED2, R11, R12, and C4. Operation requires an external current transformer 6 of proper scaling (turns ratio), which is illustrated in the system block diagram FIG. 22. These elements are now described.

When load current flows in the wire routed through the external current transformers, a current proportional to that load current is caused to exist in the secondary windings of the current transformer 6. This current flows through input interconnection terminals 62a and 62b and input load impedance R1. R1 converts this current to an AC voltage which is rectified by diode bridge CR1, filtered by C1 and limited to a maximum DC level by zener diode D1. This DC level furnishes power to operate the circuit.

The DC level across D1 is divided by voltage divider R2 and R3. The resultant voltage across R3 is the noninverting input to comparator U1A. D2, C2, R4 and R5 act as a network (steering diode, filter and voltage divider) to apply the on indication from the AC input conversation and indication block 180, described above, into the inverting input of U1A. The output of U1A will hence be held in the "low" state (near zero volts) when both inputs are applied, due to the division ratios of the two networks. U1A output will be "high" (near the supply level) when load current exists and there is no on indication signal. R6 and C3 act as a delay element, holding off the application of U1A output level to the noninverting input of comparator U1B for a period of time sufficient to account for normal system delay requirements.

The inverting input of U1B is the voltage across R8, which is an element in a voltage divider network comprised of R7 and R8. U1B noninverting input is from the output of U1A through delay elements R6 and C3 and isolation resistor R9. R10 acts a positive feedback element, providing a switching differential in the U1B operation. U1B output is "low" under normal operation.

The output of U1B will be "high" when load current exists and no on indication is present. This high level sources current into the input of U2 and LED2. R11 limits the value of this current. LED2 is illuminated when this current flows and provides visual indication of an "alarm" condition. U2 is a device which causes an equivalent AC switch closure when current flows in its input. This equivalent switch closure is a bilateral semiconductor element shown schematically as a triac which also has zero-cross line sensing elements. R12 and C4 act as a R-C "snubber" to limit dV/dt effects and protect the output device of U2. The "alarm" equivalent AC switch is available for use with external circuit elements (AC relay coils, etc) within it's rating to cause shutdown of main power or whatever the end-user desires.

Mounting Plate

Figure 25:
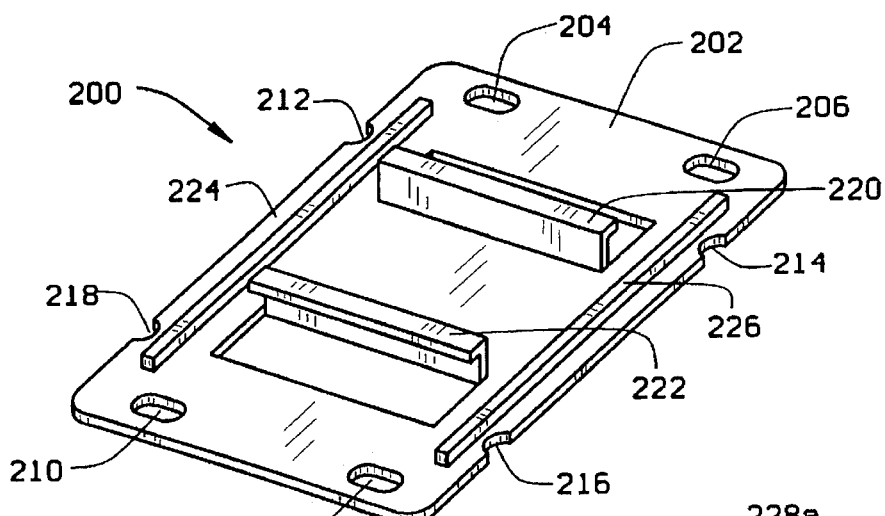
FIG. 25 illustrates an optional mounting plate for the power control system; and, FIG. 26 illustrates a power control system secured to a mounting plate.
Figure 26:
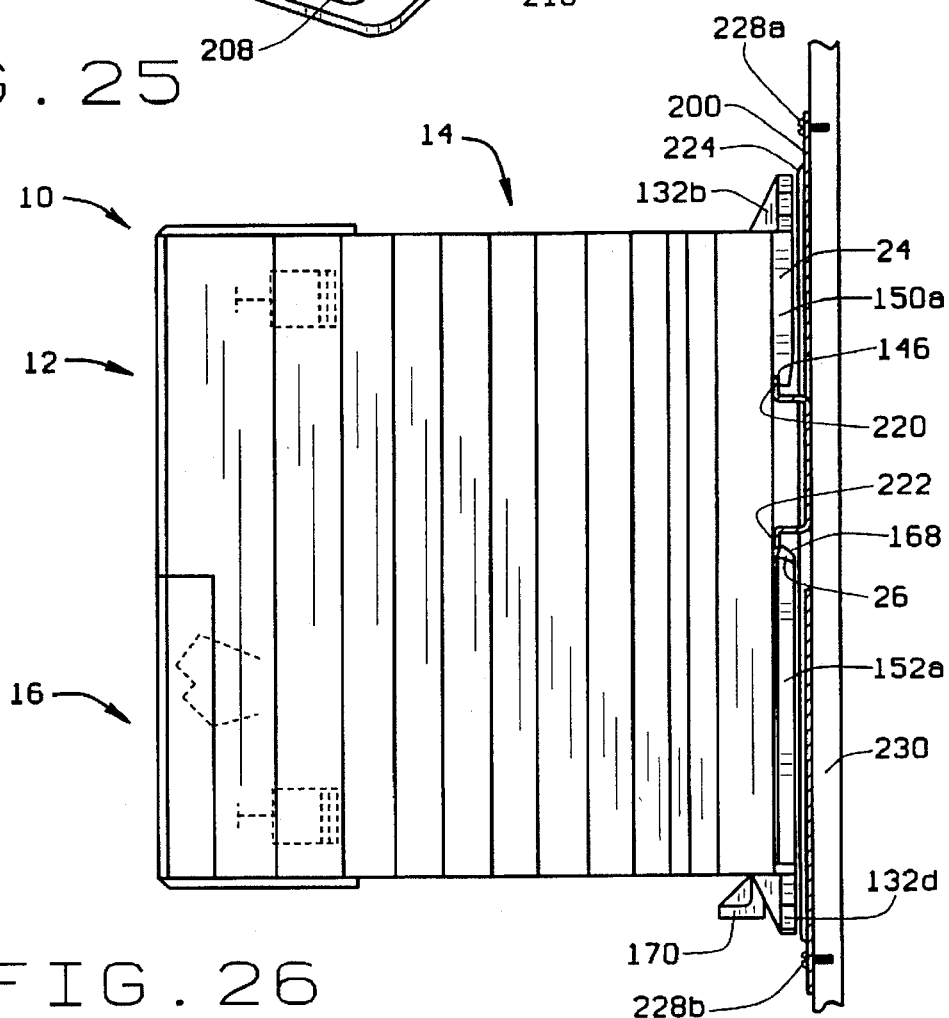

FIG. 25 illustrates a mounting plate 200 for use when a normal DIN rail is not utilized nor available for mounting of the power control system 10 where all numerals correspond to those elements previously described. The mounting plate 200 includes a planar member 202 having elongated mounting holes 204, 206, 208 and 210 located at the corners of the planar member 202. Semicircular holes 212, 214, 216 and 218 align along the edges of the planar member 202 for mounting and/or alignments. Elongated holes 204–210 and semicircular holes 212–218 accommodate screw heads or other fastening devices for securing the mounting plate 200 to a flat surface such as a panel. Angled DIN rail like members 220 and 222 extend from the planar member 202 to offer DIN rail like mounts for securation of the upper DIN rail like member 220 to the "V" groove 146 and of the lower DIN rail like member 222 behind the ramped surface 168 of the back plate 24 as illustrated in FIG. 26. Structural support rails 224 and 226 align along the longer edges for integral support along the plane of the planar member 202.

FIG. 26 illustrates the mounting of the power control system 10 to the mounting plate 200 where all numerals correspond to those elements previously described. A plurality of machine screws or other suitable fasteners 228a–228n through holes 204–210 of FIG. 24 secure the mounting plate 200 to a panel 230. The power control system 10 is then secured to the mounting plate 200 by engagement of the "V" groove 146 with the upper rail like member 200 and of the lower rail like member 220 behind the ramped surface 168 much as previously described in FIGS. 20 and 21.

Parts List 1 block diagram
5 alarm circuitry
5a ac/dc conversion
5b compare & drive
5c alarm output & indication
10 power control system
12 large cover
12a planar member
12b top
12c side
12d side
12e bottom
13 rear panel
14 heat sink
15 alignment groove
16 small cover
18 channel member
20 channel member
22 back plate assembly
24 back plate
24a front planar surface
24b edge
24c edge
24d first raised planar surface
24e second raised planar surface
26 moveable slider
28 forward planar panel
30 side member
32 side member
30a channel edge
32b channel edge
34 potting dam
34a–c compartment
36a–c compartment
34d upper chamber
34e lower chamber
34f ramped surface
34g ramped surface
34h ramped surface
34i ramped surface
36 potting dam
38 circuit board
38a–b slots
40
42a–c compression terminals
46a–c orifices
48a–c orifices
50a–c orifices
52a–c slots
53a–b slots
54a–b female latch members
55a–b female latch members
56a–b orifices
48a rectangular orifices
58d rectangular orifices
60 pad
60a–b input terminal
61 pad
62a–b terminal
26c–d alarm output terminal
62a–c latch slots
64a–b hook members
66a–b latch slots
67 escutcheon plate
68a–c alignment ports
69 escutcheon plate
70a–c alignment ports
71 SCR
71c isolation and zero-cross circuit element
71d inverse parallel SCR
72 central bus bar
72a–b bus bar end members
74 SCR
74a–b bus bar members
74c isolation and zero-cross circuit element
74d inverse parallel SCR
76 SCR
76a–b bus bar members
76c isolation and zero-cross circuit element
76d inverse parallel SCR
78 control leads
80 control leads
86a–b support members
88a–b tubular structures
90a–c tubular structures
92 small radius bore
94 large radius bore
96a–c shoulder
98a–c shoulder
100 screw
100a screwhead
102 wire
104 baffle
106 baffle
108 planar member
110 lip
112 side
114 side
116 planar member
118 hook
120 hook
121 hook
122a–c orifices
123 hook
124 vertical member
126 vertical member
124a channel member
126a channel member
128 CB mounting pad
130 raised planar portion
132a–d mounting tab
134 T shaped recess
134a sidewall
134b sidewall
134c open end
134d back surface
134e sidewall
134f sidewall
138a–d angled surfaces
138e–f angled surfaces
140 "U" shaped cutout
140a upper surface
142 stop bar
144a–n semicircular recesses
146 "V" groove
148 planar surface
150a–n ribs 152a–e ribs
154 DIN rail
154a upper DIN rail member
154b lower DIN rail member
160a–f spring beams
162 body
164 supported bar member
164a upper planar surface
164b lower planar surface
165 DIN slot
166 latch surface
168 ramped surface
170 actuator tab
172 alignment ridge
174 planar member
180 electrical circuit schematic diagram
200 mounting plate
202 planar member
204–210 elongated holes
212–218 semicircular holes
220 DIN rail like angled member
222 DIN rail like angled member While the foregoing is directed to the preferred embodiment of the present invention, other and further embodiments of the invention may be devised without departing from the basic scope thereof, and the scope thereof is determined by the claims which follow.

What is claimed is:

1. A power control system for switching power to an electrical device comprising:
   a. a source of power;
   b. an inverse parallel SCR means connected to said source of power;
   c. an isolation and zero crossing circuit connected to said inverse parallel SCR means;
   d. an input conversion and indication connected to an input signal;
   e. a switching circuit drive connected between said input conversion and indication, and said isolation and zero crossing circuit;
   f. an electrical device connected to said inverse parallel SCR means; and
   g. an alarm circuit means connected to a current transformer at said switching circuit drive for generating an alarm signal.

2. The system of claim 1 wherein said input includes defined pull-in and drop-out regions corresponding to specific coil voltages.

3. The system of claim 1 wherein said input includes a snubber means.

4. The system of claim 3 wherein said snubber means is an R-C circuit.

5. A power control system for switching power to an electrical device comprising:
   a. a source of power;
   b. an inverse parallel SCR means connected to said source of power;
   c. an isolation and zero crossing circuit connected to said inverse parallel SCR means;
   d. an input conversion and indication circuit connected to a signal input, said input circuit including defined pull-in and drop-out regions corresponding to specific coil voltages;
   e. a switching circuit drive connected between said input conversion and indication circuit, and said isolation and zero crossing circuit; and
   f. an electrical device connected to said inverse parallel SCR means whereby said input and indication circuit emulates a contactor with a defined pull-in and drop-out regions and operates with a common solid state output device which has an R-C snubber in parallel.

6. A power control system for switching power to an electrical device comprising:
   a. a source of AC power;
   b. an inverse parallel SCR means connected to said source of AC power;
   c. an isolation and zero crossing circuit connected to said inverse parallel SCR means;
   d. an input conversion and indication circuit connected to a signal input including an input impedance controlling snubber means coupled across input terminals of said input conversion and indication circuit;
   e. a switching circuit drive connected between said input conversion and indication circuit, and said solation and zero crossing circuit; and
   f. an electrical device connected to said inverse parallel SCR means whereby said input and indication circuit emulates a contactor with defined pull-in and drop-out regions and operates with a common solid state output device that has an R-C snubber in parallel.

7. The system of claim 6 wherein said snubber means is an R-C circuit.

* * * * *